(12) United States Patent
Phillips, III et al.

(10) Patent No.: US 8,496,360 B2
(45) Date of Patent: Jul. 30, 2013

(54) LED LIGHTING APPARATUS WITH REFLECTORS

(75) Inventors: William E. Phillips, III, Cincinnati, OH (US); Todd S. Rutherford, Cincinnati, OH (US)

(73) Assignee: EYE Lighting International of North America, Inc., Mentor, OH (US)

( * ) Notice: Subject to any disclaimer, the term of this patent is extended or adjusted under 35 U.S.C. 154(b) by 0 days.

(21) Appl. No.: 13/588,992

(22) Filed: Aug. 17, 2012

(65) Prior Publication Data

US 2012/0307496 A1    Dec. 6, 2012

Related U.S. Application Data

(62) Division of application No. 13/483,045, filed on May 29, 2012.

(60) Provisional application No. 61/490,265, filed on May 26, 2011, provisional application No. 61/511,085, filed on Jul. 24, 2011, provisional application No. 61/490,278, filed on May 26, 2011.

(51) Int. Cl.
*F21V 33/00*        (2006.01)

(52) U.S. Cl.
USPC .............. 362/311.02; 362/249.02; 362/245; 362/545

(58) Field of Classification Search
USPC ............... 362/545, 431, 249.02, 247, 245, 362/311.02
See application file for complete search history.

(56) References Cited

U.S. PATENT DOCUMENTS

| | | | |
|---|---|---|---|
| 2004/0174706 A1* | 9/2004 | Kan | 362/241 |
| 2009/0225543 A1* | 9/2009 | Jacobson et al. | 362/247 |
| 2012/0026737 A1* | 2/2012 | Dinc et al. | 362/247 |

* cited by examiner

*Primary Examiner* — Laura Tso
(74) *Attorney, Agent, or Firm* — D.A. Stauffer Patent Services LLC

(57) ABSTRACT

An LED lighting apparatus and method provide efficient illumination in a downward and forward direction toward a preferential side, by mounting a plurality of LED devices to the apparatus in at least one horizontal row oriented perpendicularly to the downward and forward direction; mounting a vertical reflector behind and parallel to the horizontal row; and orienting the LED apparatus such that the vertical reflector extends substantially straight downward. A two axis orthogonally symmetric secondary lens is associated with each LED and the vertical reflector has a specular reflective front surface facing the LEDs. The vertical reflector may be curved around ends of the row of LEDs. Also it may be continued further downward, on the outside of a cover lens, by a backlight shield with a straight linear outer edge that extends horizontally across an uplight ring shield. The backlight shield may have a specular or diffuse reflecting front surface.

26 Claims, 13 Drawing Sheets

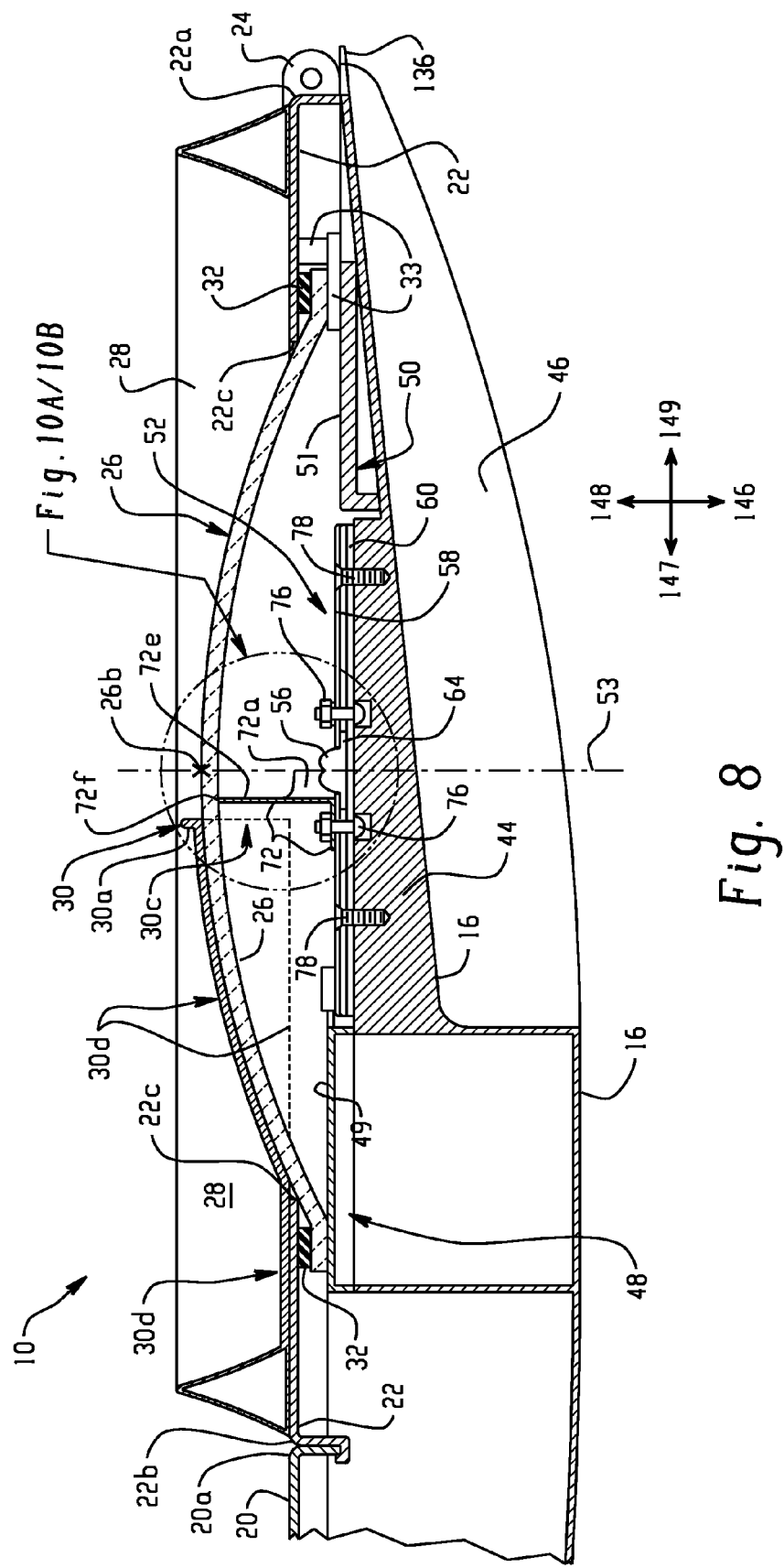

LED LIGHTING APPARATUS WITH REFLECTORS

CROSS-REFERENCE TO RELATED APPLICATIONS

This application is a Division of U.S. application Ser. No. 13/483,045 filed May 29, 2012 by William E. Phillips, et al. and entitled REFLECTORS OPTIMIZED FOR LED LIGHTING FIXTURE; which claims the benefit of U.S. Provisional Application No. 61/490,265 filed May 26, 2011 by William E. Phillips, and entitled LED LIGHTING APPARATUS WITH REFLECTORS; and of U.S. Provisional Application No. 61/511,085 filed Jul. 24, 2011 by William E. Phillips, et al., and entitled LED LIGHTING APPARATUS, OPTICS, AND DESIGN METHODS; and of U.S. Provisional Application No. 61/490,278 filed May 26, 2011 by William E. Phillips, and entitled BACK REFLECTOR OPTIMIZED FOR LED LIGHTING FIXTURE.

All of the applications listed hereinabove have at least one applicant in common, and all are incorporated in their entirety herein by reference.

This application relates to other non-provisional Utility patent applications that may be co-pending when all are filed:
- US patent application entitled EXTENDED LED LIGHT SOURCE WITH OPTIMIZED FREE-FORM OPTICS, (presently unfiled Division of application Ser. No. 13/557,207);
- U.S. patent application Ser. No. 13/557,207 filed Jul. 24, 2012 and entitled EXTENDED LED LIGHT SOURCE WITH COLOR DISTRIBUTION CORRECTING OPTICS; and
- US patent application entitled ASPHERICAL INNER SURFACE FOR LED SECONDARY LENS, (presently unfiled Division of application Ser. No. 13/557,207).

TECHNICAL FIELD OF THE INVENTION

The present invention relates generally to the field of lighting systems and, more particularly, to apparatus for utilizing LED (light emitting diode) sources for illuminating areas with a predefined pattern of light intensity on a ground plane.

BACKGROUND OF THE INVENTION

With a continuing quest for lighting apparatus which is low-cost and energy efficient, LEDs have proven to provide light sources which are inherently energy efficient and with advances in LED technology, continue to increase power efficiency as well as life. Further improvements in overall efficiency are sought by efforts to improve the utilization of light output being directed into a desired lighting area. Being that LEDs used as light sources are typically of a small size, there is an additional cost-efficiency and other benefits because the fixtures can be more compact, thereby, for example, reducing material usage, weight, and wind resistance for LED lighting apparatuses.

Lighting systems for various uses typically require the prevention of stray light entering areas not intended to be lit. For example, roadway and parking lot lighting systems are designed to have high levels of light distribution over areas which are to be lighted, while neighboring regions are as free of light as possible. For example, outdoor lighting should not emit light "upward" into the sky. That is, there is a need to be able to direct light in a desired downward and lateral direction onto a predetermined section of property while avoiding light distribution onto an adjacent property. Commonly used "predetermined sections of property" may be referenced according to IES standards for "large area" lighting patterns on a planar surface such as the "ground". Well-known IES standards for "Type II, Type III, Type IV, and Type V" illuminance patterns are particularly relevant, wherein Type V is "straight-down" lighting with a square boundary (e.g., for parking lot lighting), and the other Types II-IV specify generally rectangular area boundaries that are laterally offset in a preferred direction. Satisfying such concerns can be difficult when LEDs are used as a light source because typically many LEDs are used in a fixture, so light output from an extended light source is particularly difficult to direct into a reasonably uniform level of illumination confined within the boundaries of a prescribed illuminance pattern.

It would be desirable to have an improved efficiency LED light fixture with directional features that improve the illuminance (lighting level) uniformity within a predetermined "large area" lighting pattern. It is further desirable to maximize the amount of light that is directed into the predetermined lighting pattern while minimizing light falling outside the boundaries of the pattern, most particularly for patterns that are offset in a preferential direction from the LED light fixture.

BRIEF SUMMARY OF THE INVENTION

An LED lighting apparatus and method of operating the apparatus is disclosed for illumination toward a preferential side in a downward and forward direction.

According to the invention, the LED apparatus includes a plurality of LED devices arranged in one or more horizontal rows oriented perpendicularly to the downward and forward directions and mounted to the LED apparatus; a two axis orthogonally symmetric lens member associated with each LED device; and a vertical reflector, being a vertically extending substantially planar reflective surface, disposed rearward of and parallel to at least one of the one or more horizontal rows of LED devices; wherein: the vertical direction is defined as an orthogonal z-axis of the LED apparatus and is perpendicular to the horizontal direction that defines a laterally extending second orthogonal axis of the LED apparatus.

In an embodiment of the invention, there is a single row arrangement of the plurality of LED devices.

In an embodiment of the invention, the vertical reflector comprises a specular reflective front surface facing the LED devices.

In an embodiment of the invention, the vertical reflector is curved around ends of the one or more horizontal rows.

In an embodiment of the invention, the LED apparatus further comprises an enclosure wherein the one or more horizontal rows are mounted inside the LED apparatus; and a cover lens is mounted to the LED apparatus so as to cover the one or more horizontal rows of LED devices. Furthermore, the vertical reflector may comprise a top edge contoured to closely fit under an inner surface of the cover lens. There may be a backlight shield mounted over an outer surface of the cover lens, the shield comprising a substantially planar vertical wall extending across the cover lens parallel to the one or more rows of LED devices. Also, the vertical wall of the backlight shield may comprise a bottom edge contoured to closely fit over the outer surface of the cover lens; and a distal top edge that describes a straight horizontal line.

In an embodiment of the invention, the LED apparatus further comprises a horizontal reflector, being a horizontally extending diffusely reflective surface, disposed across at least a portion of the LED apparatus, and having one or more openings shaped and sized to closely fit around the lens members where they protrude through the horizontal reflector.

According to another embodiment of the invention, an LED apparatus for illumination in downward and forward directions toward a preferential side of the apparatus, comprises a plurality of LED devices arranged in a single horizontal row oriented perpendicularly to the downward and forward directions and mounted to the LED apparatus; and a vertical reflector, being a vertically extending substantially planar reflective surface, disposed rearward of, and parallel to the row of LED devices to re-direct light emitted rearward from the plurality of LED devices; wherein the vertical direction is defined as an orthogonal z-axis of the LED apparatus and is perpendicular to the horizontal direction that defines a laterally extending second orthogonal axis of the LED apparatus.

In an embodiment of the invention, the vertical reflector is curved around ends of the row of LED devices.

In an embodiment of the invention, the LED apparatus further comprises an enclosure wherein the row of LED devices is mounted inside the LED apparatus; and the vertical reflector has an inner part within the LED apparatus and an outer part outside the LED apparatus. Furthermore, there may be a cover lens mounted to the LED apparatus so as to cover the row of LED devices; and which divides the inner part from the outer part of the vertical reflector. Even further, the inner part of the vertical reflector may have a specular reflective front surface facing the LED devices, and a top edge contoured to closely fit under an inner surface of the cover lens; and the outer part of the vertical reflector may have a bottom edge contoured to closely fit over an outer surface of the cover lens. Also, there may be a ring shield mounted to the LED apparatus such that the outer part of the vertical reflector extends laterally across the ring shield. In an embodiment, the outer part of the vertical reflector has a top edge that describes a straight horizontal line. Furthermore, the outer part of the substantially planar vertical reflector may be set back from the substantially planar reflective surface of the inner part of the vertical reflector.

According to the invention, a method of directing illumination from an LED apparatus in downward and forward directions toward a preferential side forward of the LED apparatus includes: mounting a plurality of LED devices to the LED apparatus in a single horizontal row oriented perpendicularly to the downward and forward direction; mounting a substantially planar vertical reflector to the LED apparatus rearward of and parallel to the horizontal row of LED devices; and orienting the LED apparatus such that the vertical reflector extends substantially straight downward.

According to an embodiment of the invention, the method further includes the step of associating a two axis orthogonally symmetric lens member with each LED device. A further step may be providing the vertical reflector with a specular reflective front surface facing the LED devices. A further step may be disposing the vertical reflector to be set back from the lens members at least a minimum distance that prevents LED light from re-entering a lens member after reflecting off of the vertical reflector front surface.

According to an embodiment of the invention, the method further includes the step of curving the vertical reflector around ends of the row of LED devices.

According to an embodiment of the invention, the method further includes the steps of mounting a cover lens to the LED apparatus so as to cover the row of LED devices; and contouring a top edge of the vertical reflector to closely fit under an inner surface of the cover lens. A further step includes using a backlight shield to continue the vertical reflector outward of the cover lens.

According to an embodiment of the invention wherein the backlight shield comprises a substantially planar, generally outward extending wall with a forward facing surface, the method further comprises contouring a bottom edge of the backlight shield to closely fit over an outer surface of the cover lens; and relative to the top edge of the vertical reflector, setting back the bottom edge of the backlight shield at least enough to intercept LED light that just passes over the top edge of the vertical reflector, thereby compensating for the thickness of the cover lens.

According to an embodiment of the invention, the method further includes providing the backlight shield with a specular reflective forward facing surface; and orienting the substantially planar forward facing surface of the backlight shield to be parallel to an uncurved portion of the substantially planar vertical reflector.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawing figures. The figures are intended to be illustrative, not limiting. Although the invention is generally described in the context of these preferred embodiments, it should be understood that it is not intended to limit the spirit and scope of the invention to these particular embodiments.

Certain elements in selected ones of the drawings may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity.

Elements of the figures can be numbered such that similar (including identical) elements may be referred to with similar numbers in a single drawing. For example, each of a plurality of elements collectively referred to as 199 may be separately referenced as 199a, 199b, 199c, etc. Or, related but modified elements may have the same number but are distinguished by primes. For example, 109, 109', and 109" are three different versions of an element 109 which are similar or related in some way but are separately referenced for the purpose of describing various modifications/embodiments of the parent element (109). Such relationships, if any, between similar elements in the same or different figures will become apparent throughout the specification, including, if applicable, in the claims and abstract.

Figure 1:
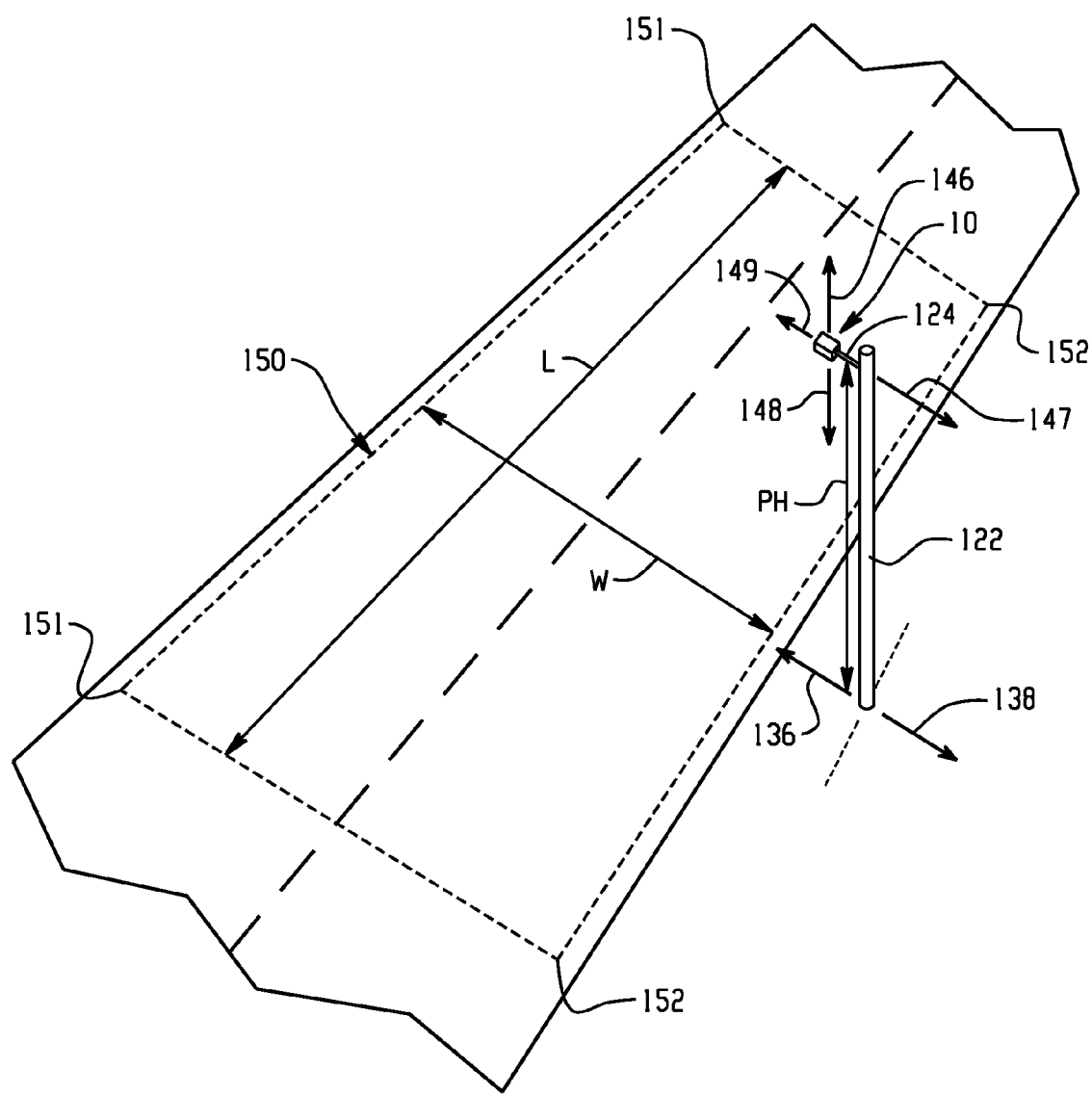
Figure 2:
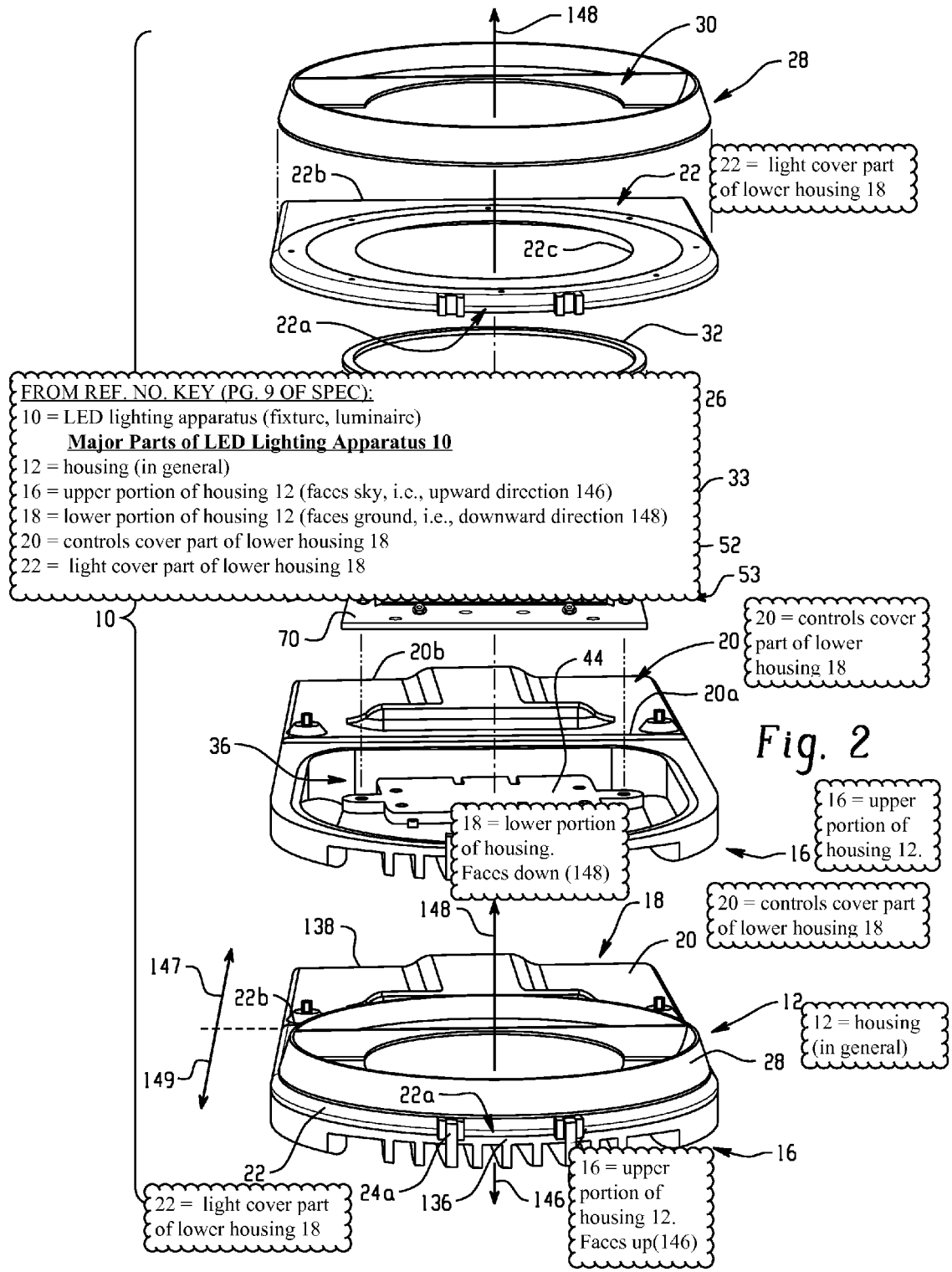
Figure 3:
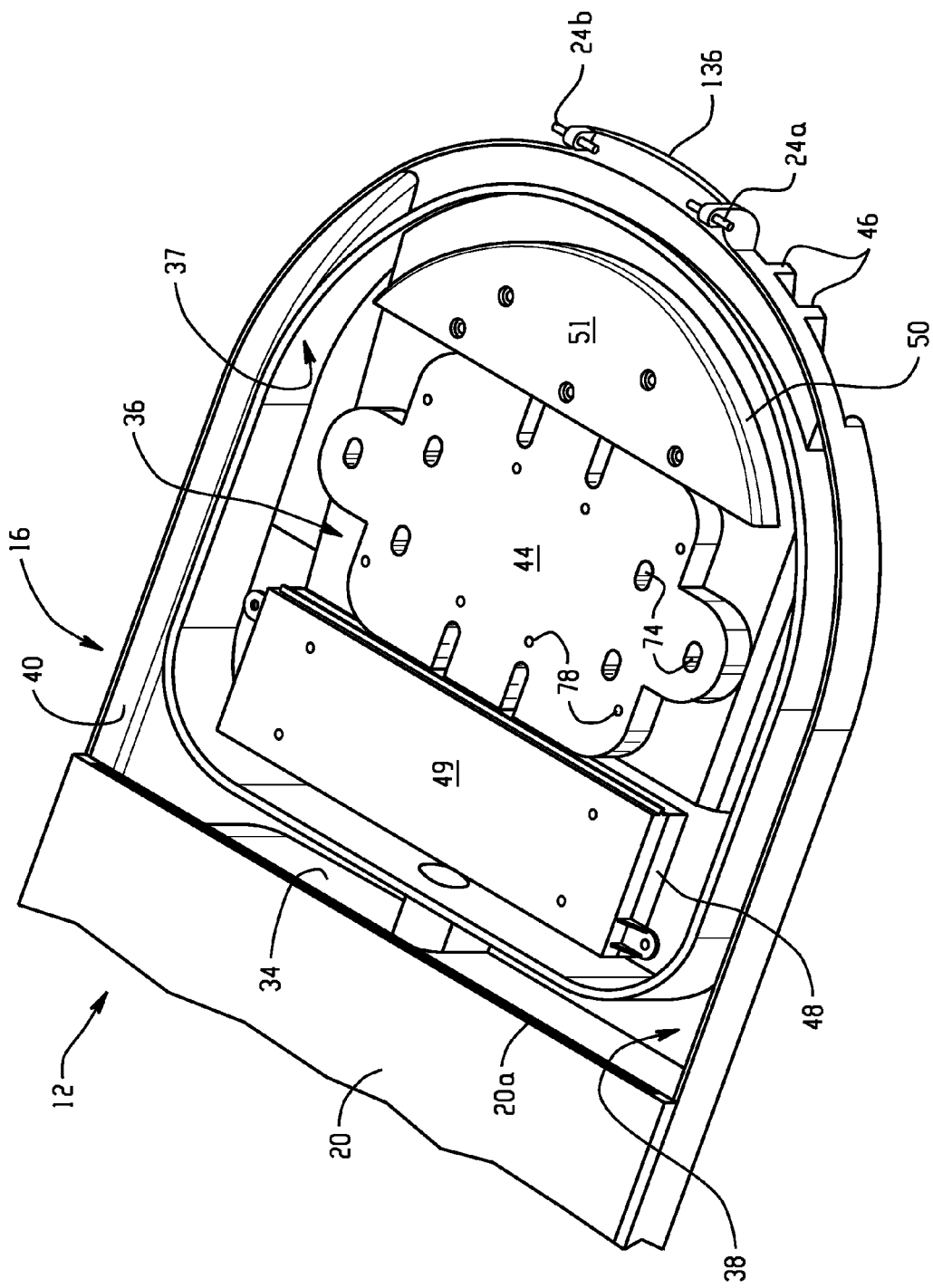
Figure 4:
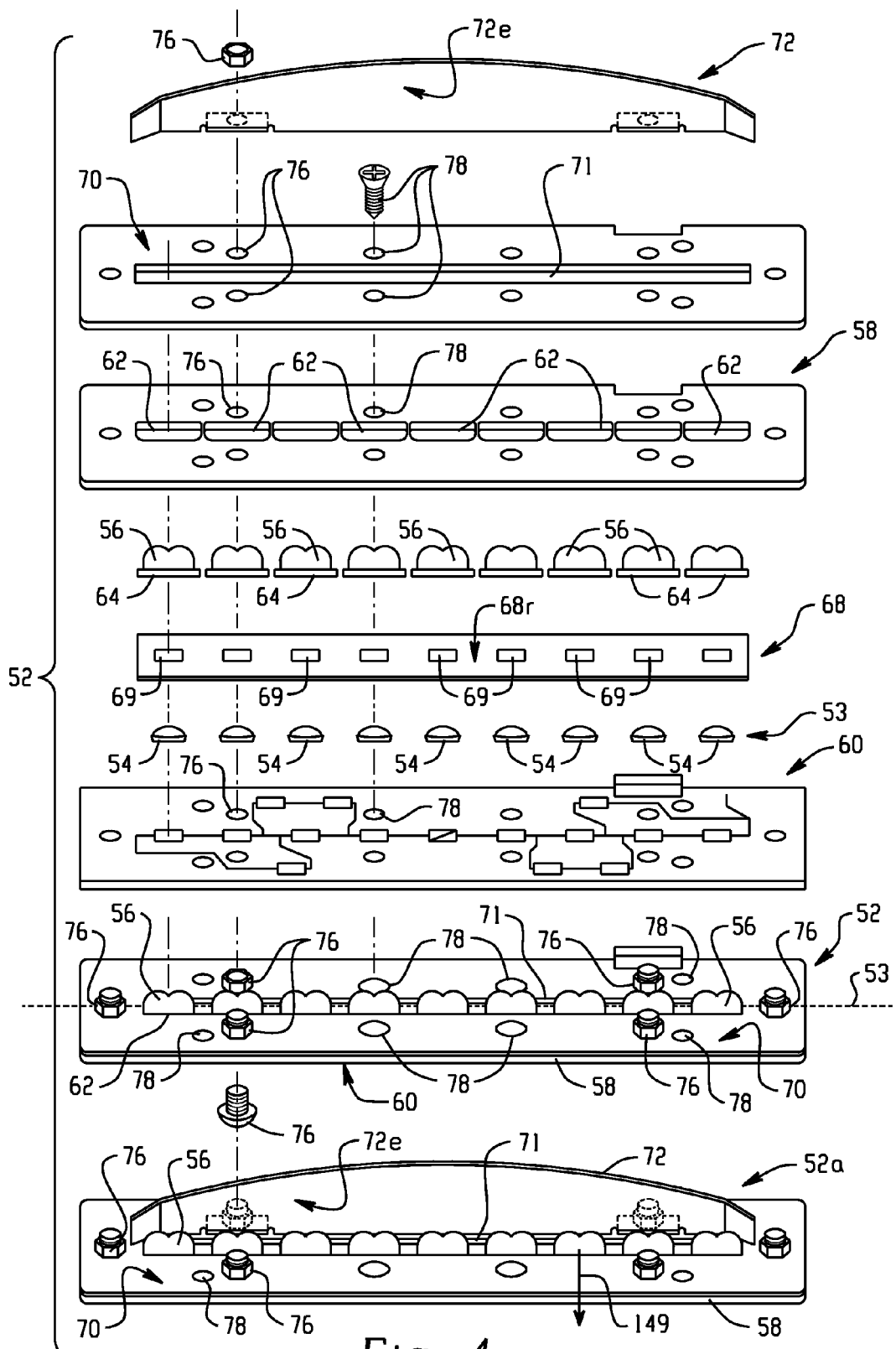
Figure 5:
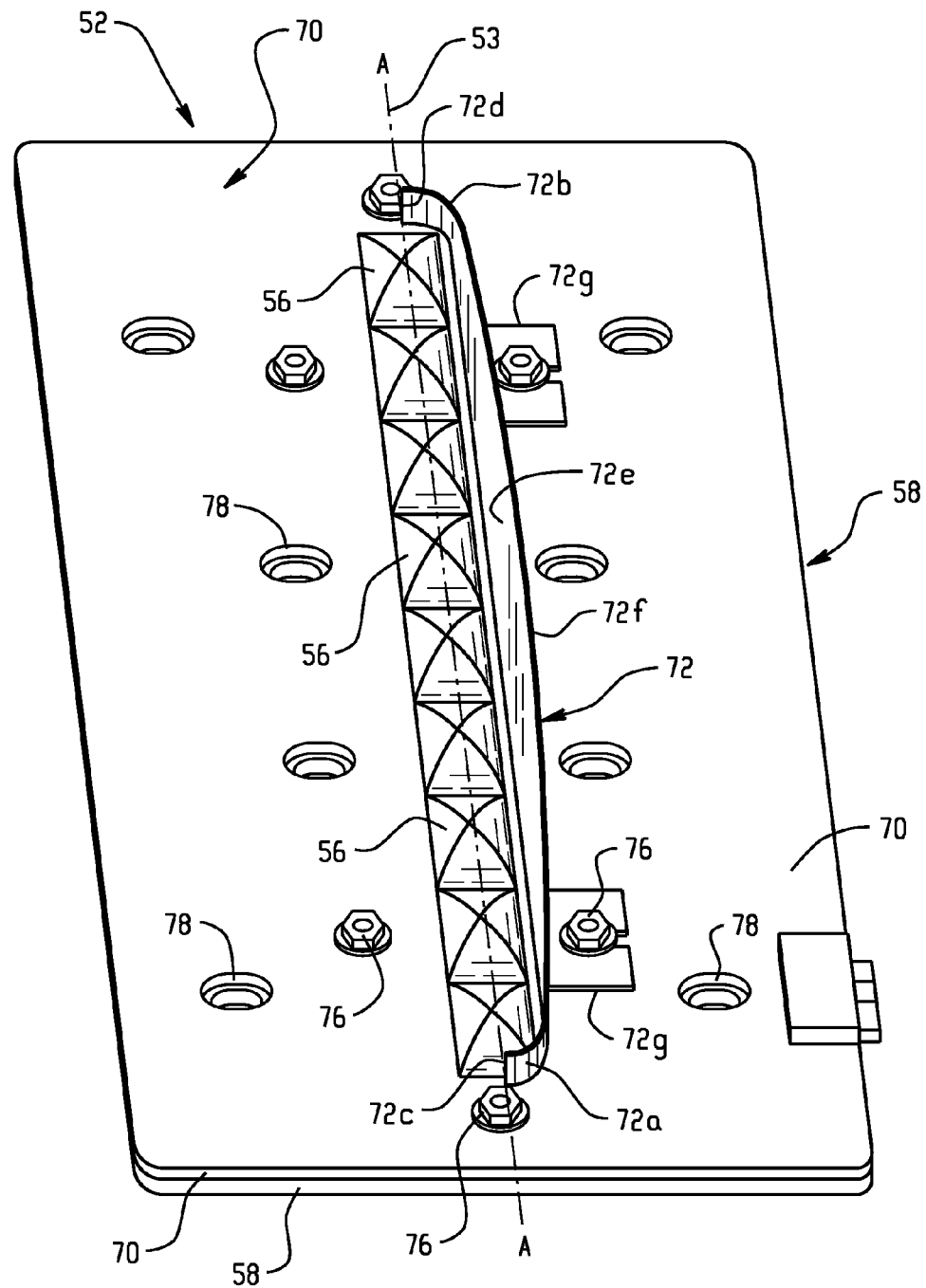
Figure 6:
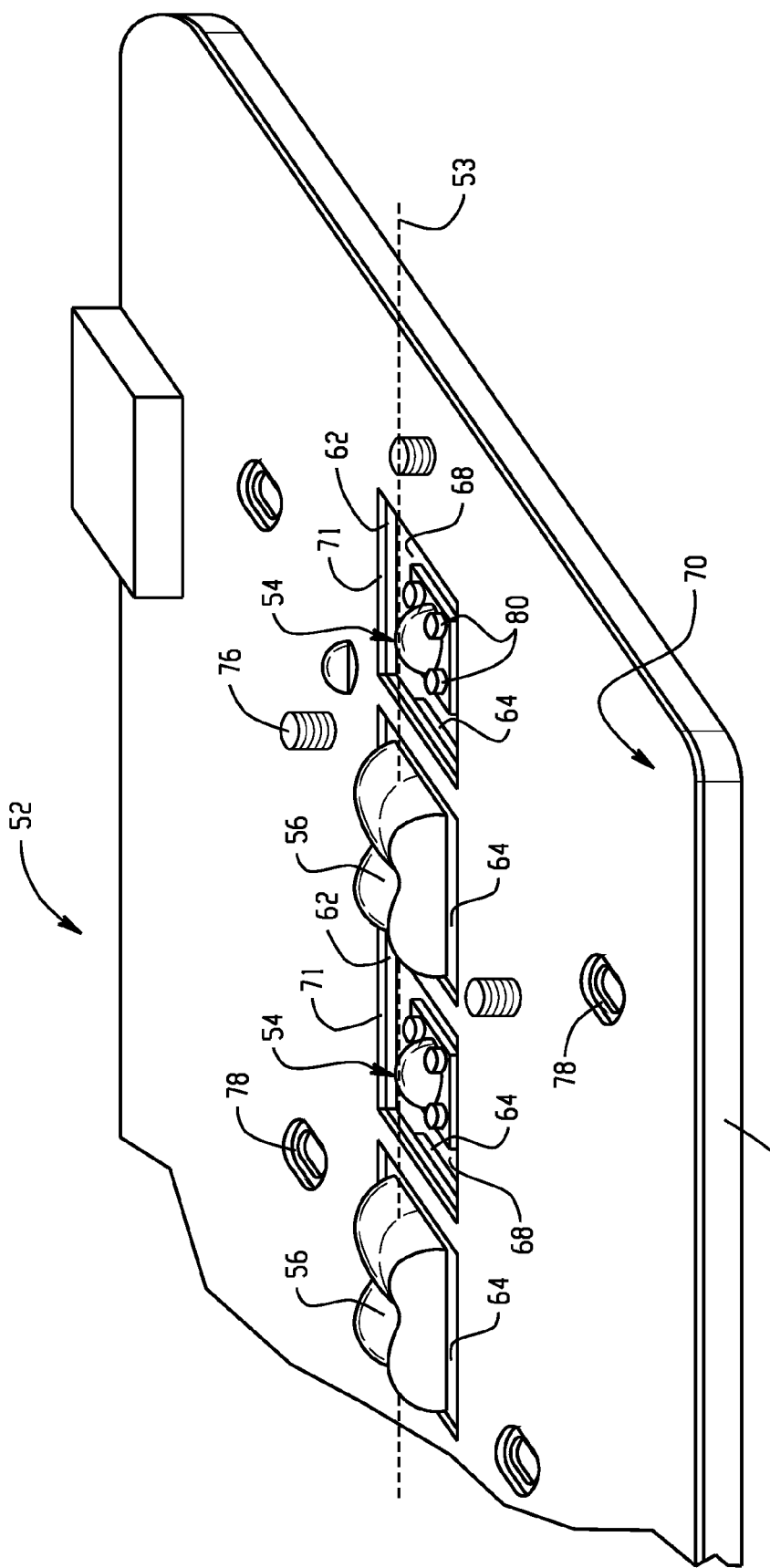
Figure 7:
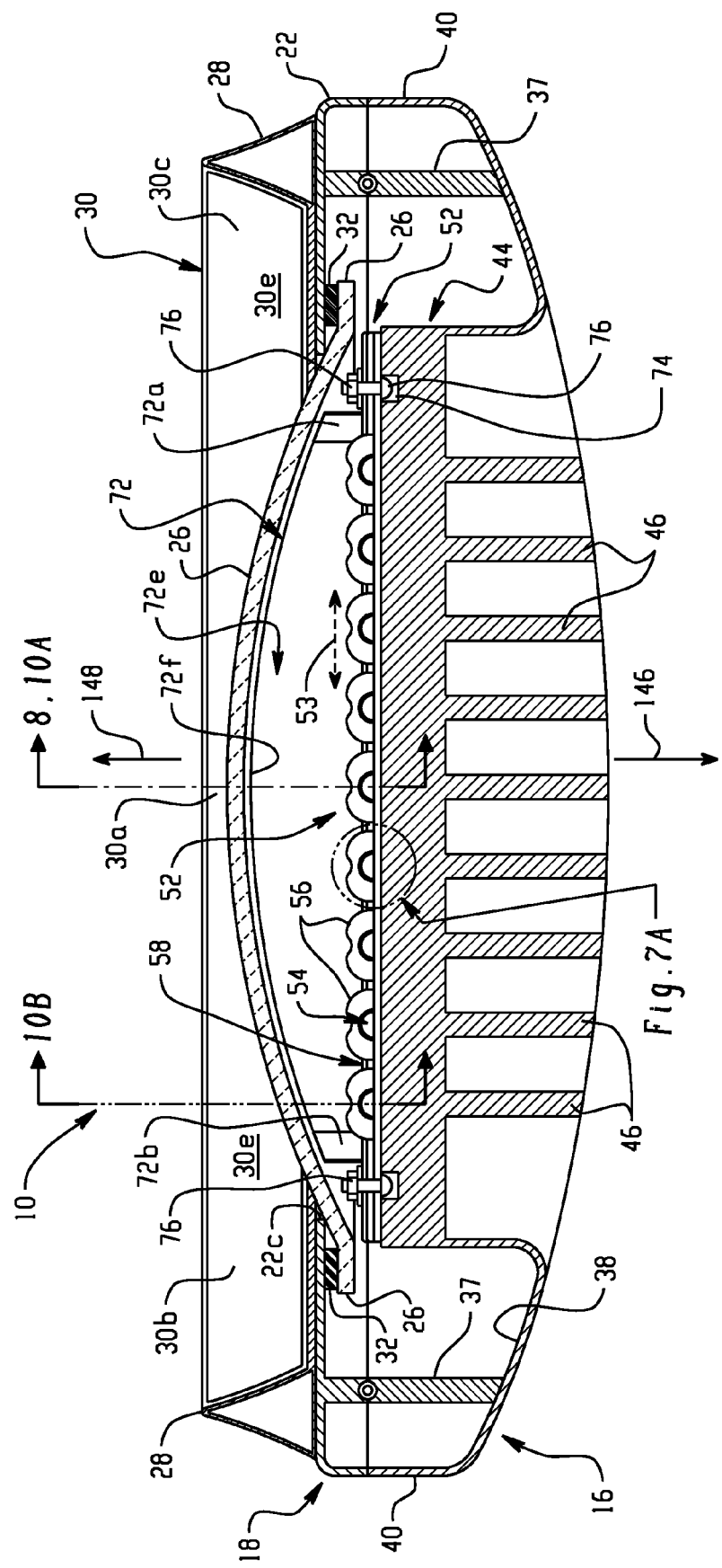
Figure 7A:
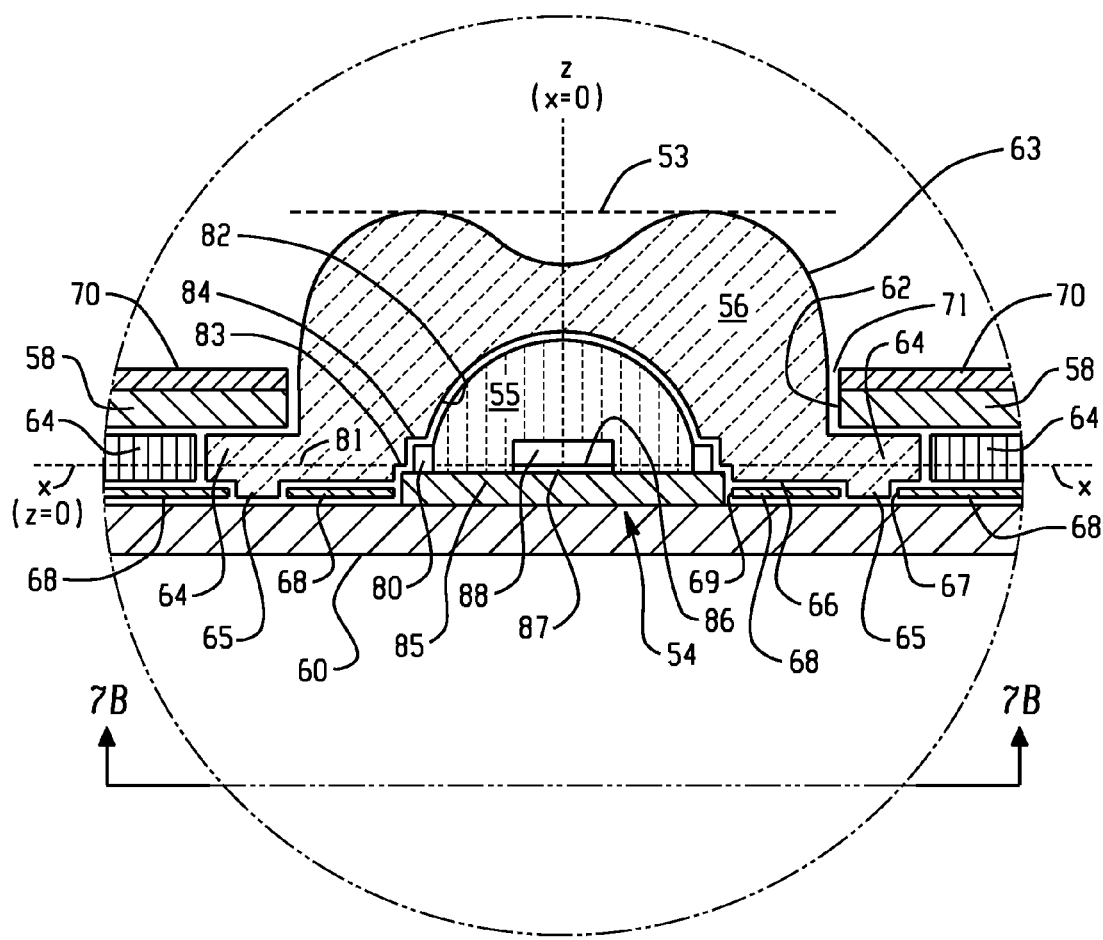
Figure 7B:
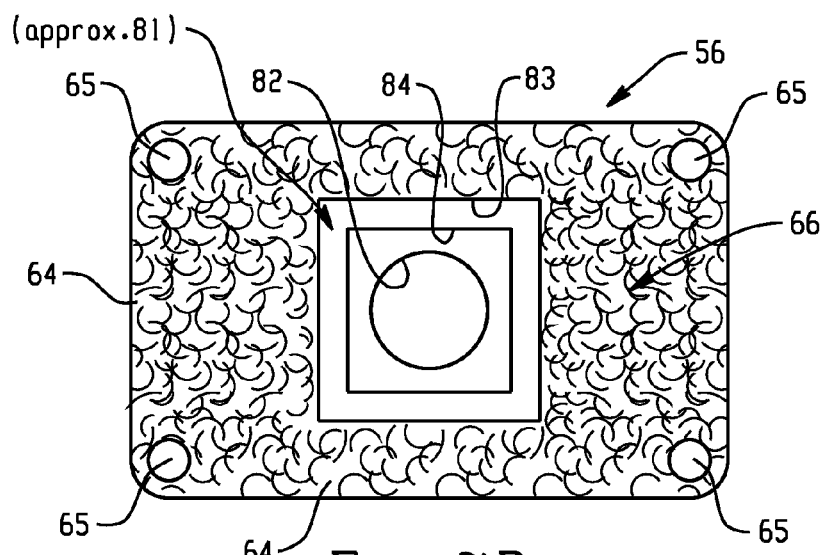
Figure 9:
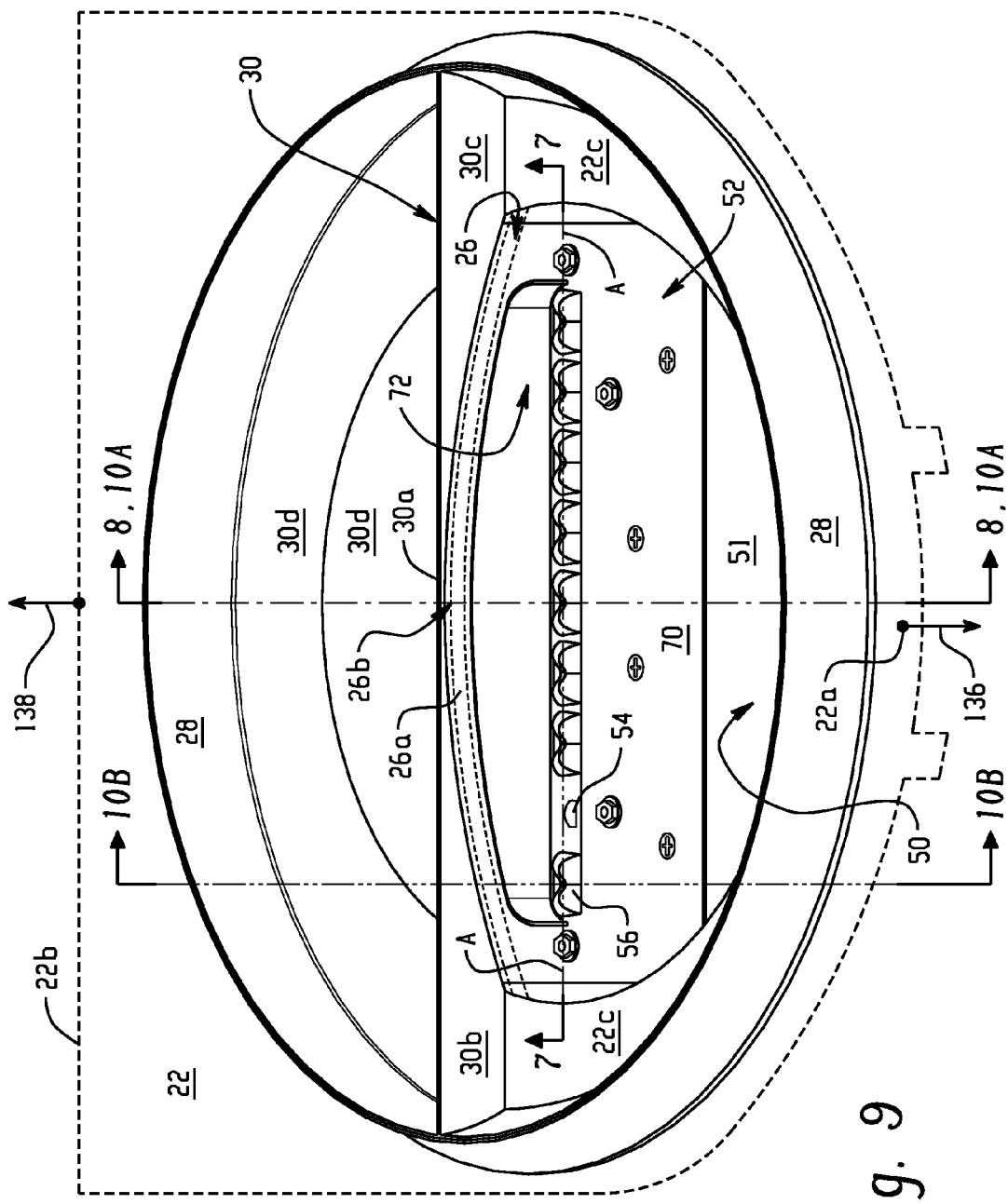
Figure 10A:
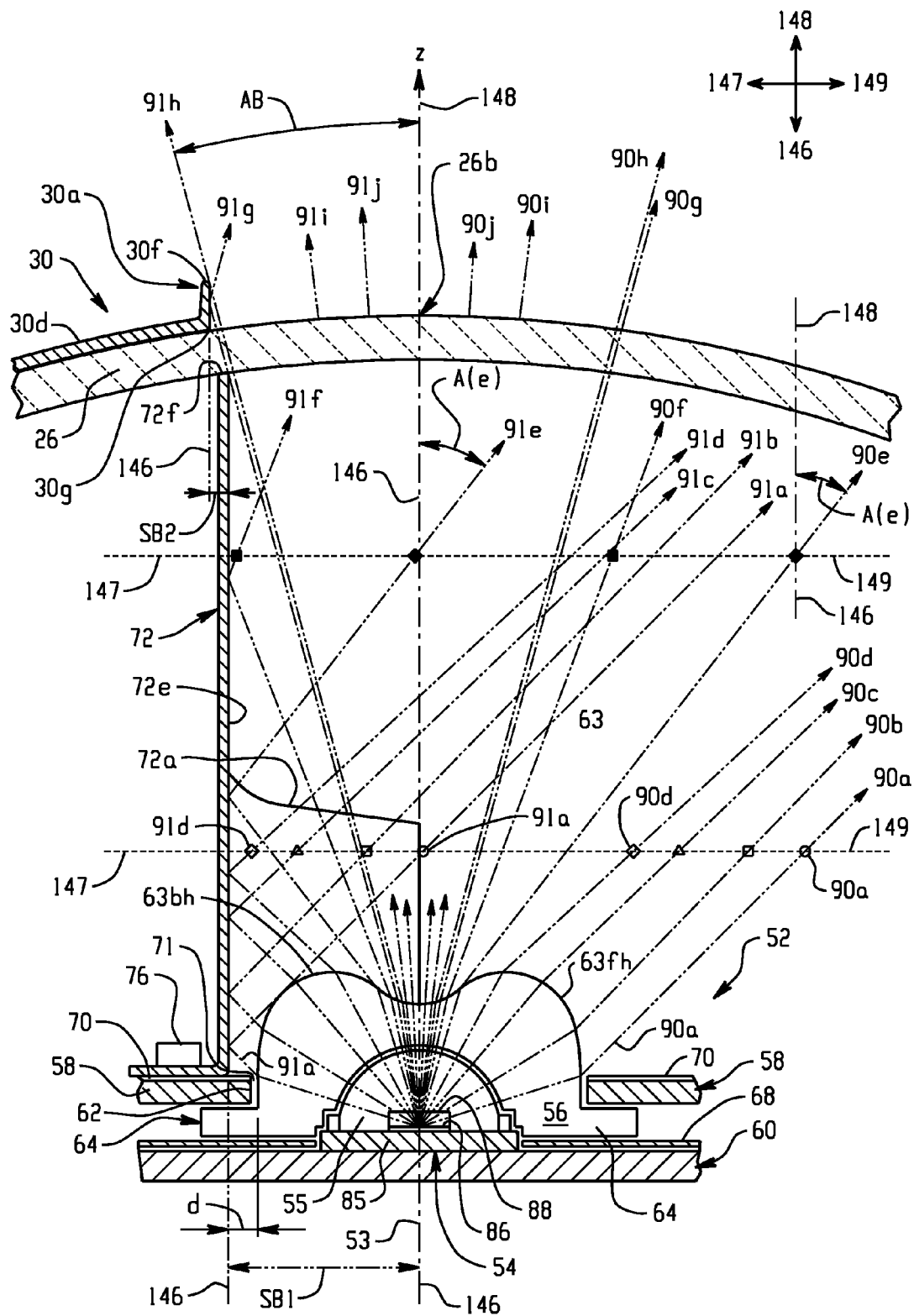
Figure 10B:
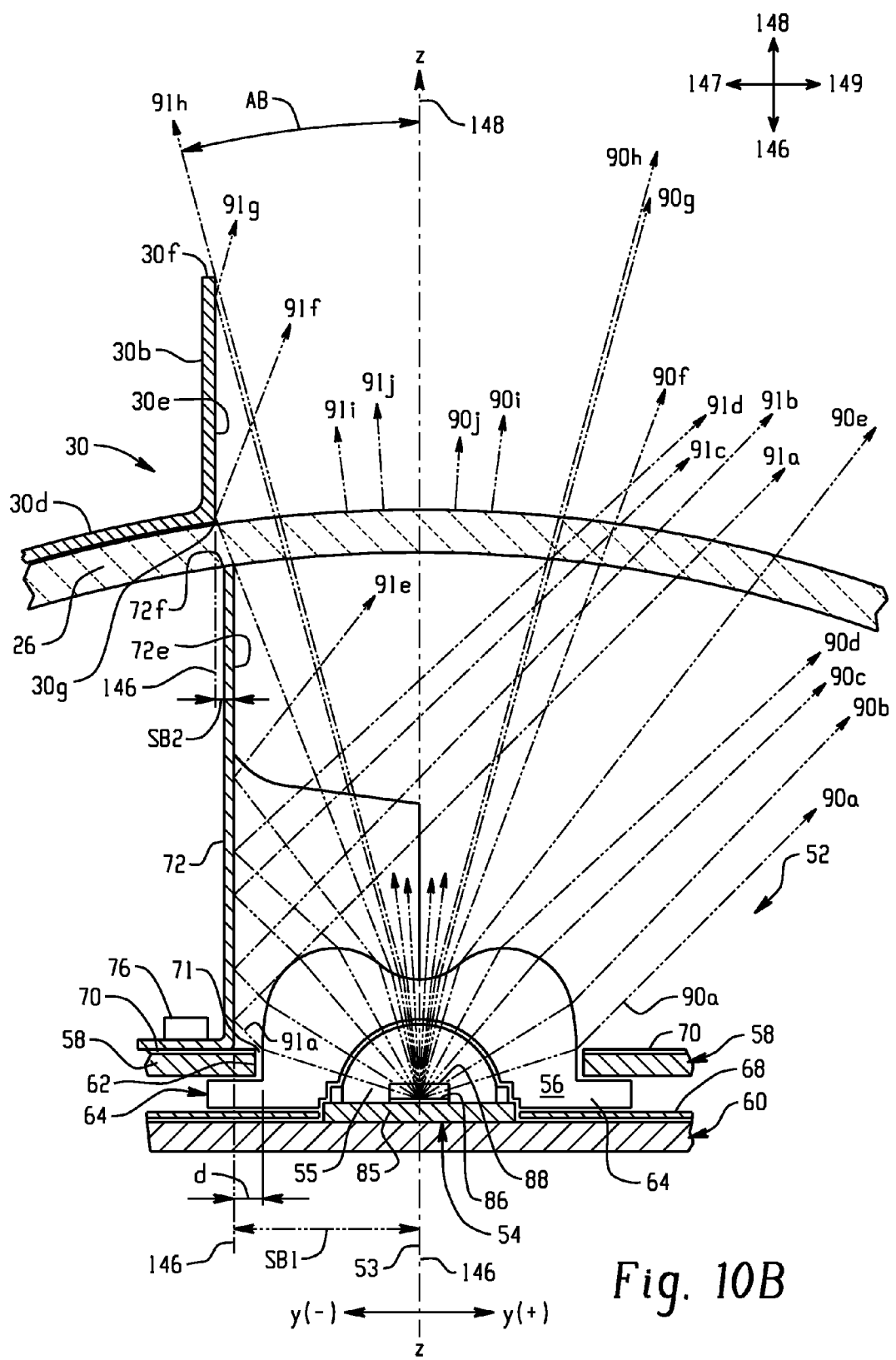
Figure 10C:
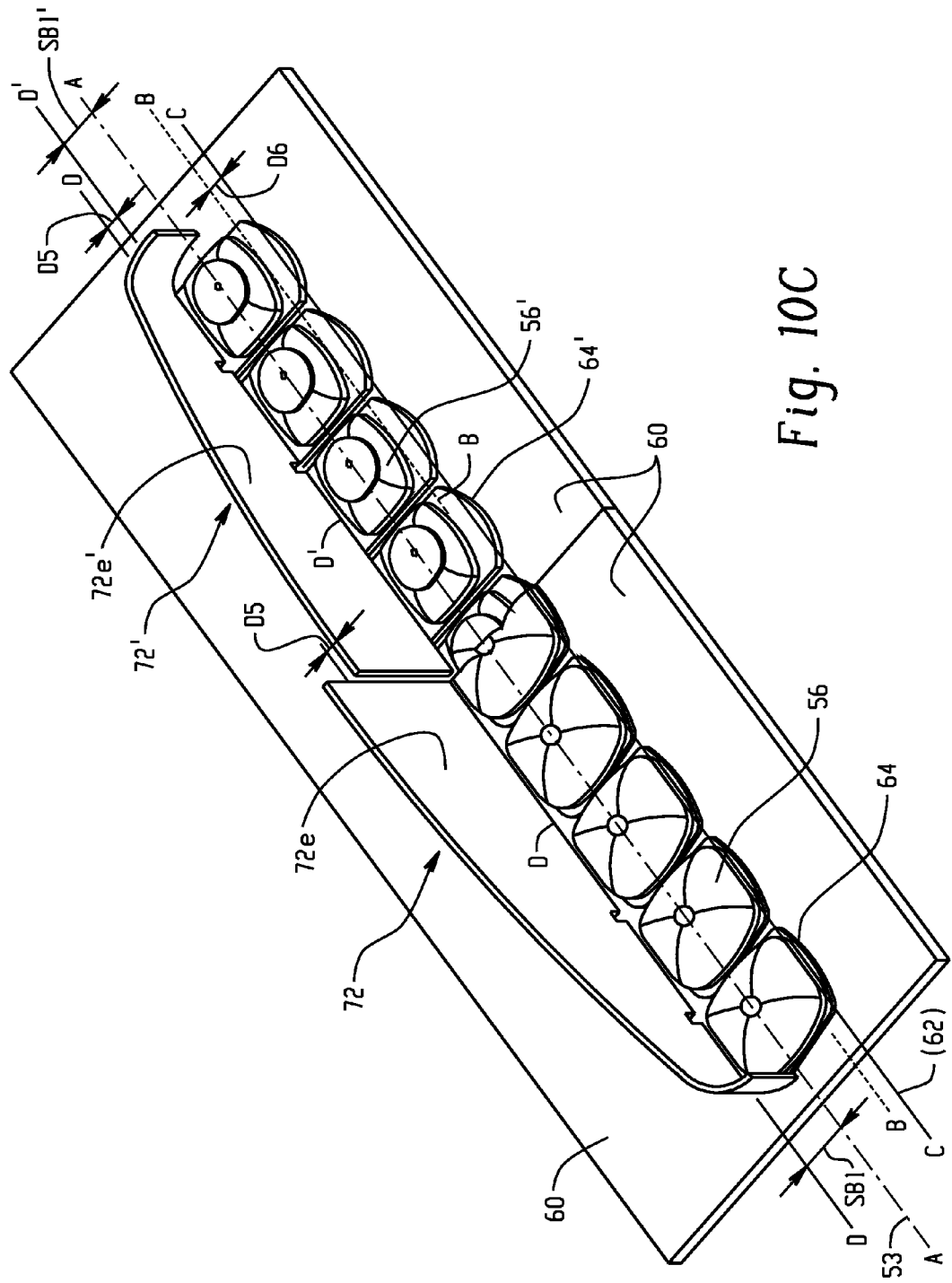

The structure, operation, and advantages of the present preferred embodiment of the invention will become further apparent upon consideration of the following description taken in conjunction with the accompanying drawings, wherein:

FIG. 1 is a three dimensional view of an LED lighting apparatus shown in the context of being mounted on a pole for lighting an area on the ground below;

FIG. 2 is an exploded three dimensional view of the LED lighting apparatus with reflectors, according to the present invention;

FIG. 3 is a three dimensional view of the housing for the LED lighting apparatus with reflectors with the control cover and the light cover removed, according to the present invention;

FIG. 4 is an exploded three dimensional view of the LED module assembly of the LED lighting apparatus with reflectors, according to the present invention;

FIG. 5 is a three dimensional top view of the assembled LED module assembly of the LED lighting apparatus with reflectors, according to the present invention;

FIG. 6 is a three dimensional view of the LED module of FIG. 5 without the vertical reflector and without two of the secondary lenses of the LED lighting apparatus with reflectors, according to the present invention;

FIG. 7 is a cross-sectional, front side view along the line 7-7 of FIG. 9 of the LED lighting apparatus with reflectors, according to the present invention;

FIG. 7A is a magnified view of the circled portion of FIG. 7 showing the secondary lens mounted over the primary lens of an LED in the LED module of the LED lighting apparatus with reflectors, according to the present invention;

FIG. 7B is a bottom view of the secondary lens viewed in the direction indicated by arrows on the line 7B-7B of FIG. 7A, according to the present invention;

FIG. 8 is a cross sectional lateral side view along the line 8-8 of FIG. 9 of the LED lighting apparatus with reflectors, according to the present invention;

FIG. 9 is a three dimensional top front view of the LED module assembly mounted under the light cover portion of the LED lighting apparatus with reflectors, according to the present invention;

FIG. 10A is a magnified view of the circled portion of FIG. 8 marked 10A, showing exemplary rays of light emitted from an LED, passing through a secondary lens, and some rays reflecting from the vertical reflector behind the secondary lens of the LED lighting apparatus with reflectors, according to the present invention;

FIG. 10B is a view like that of FIG. 10A but taken along the line 10B-10B of FIG. 9, showing exemplary rays of light emitted from an LED, passing through a secondary lens, and some rays reflecting from the vertical reflector behind the secondary lens while some other rays reflect from the back light shield of the LED lighting apparatus with reflectors, according to the present invention; and FIG. 10C is a perspective view of two superimposed portions of LED modules having two different secondary lens types, showing potential differences in reflector setback SB1 between the two, according to the present invention.

DETAILED DESCRIPTION OF THE INVENTION

Reference Number Key, Term Definitions

Note that some of the following references may not be used in the present application but will be used (illustrated and further described) in others of a set of co-pending related applications. The potentially unused references are included herein for consistency and overall understanding, and also because the series of related applications share significant portions of the detailed description and drawings.

| NUM. | ELEMENT |
|---|---|
| 10 | LED lighting apparatus (fixture, luminaire) |
| | Major Parts of LED Lighting Apparatus 10 |
| 12 | housing (in general) |
| 16 | upper portion of housing 12 (faces sky, i.e., upward direction 146) |
| 18 | lower portion of housing 12 (faces ground, i.e., downward direction 148) |
| 20 | controls cover part of lower housing 18 |
| 20a, b | a = front edge, b = back end (20b is also back of 10) |
| 21 | back hinges (a, b) |
| 22 | light cover part of lower housing 18 |
| 22a, b | a = front end, b = back edge (22a is also front of 10) |
| 22c | aperture/opening/hole in light cover where cover lens is mounted and light emitted |
| 24 | front hinges (a, b) |
| 26 | cover lens (for vandal and environmental protection) a.k.a. outer lens, cover glass, drop lens |
| 26a | convex section of a dome shaped cover lens |
| 26b | center point of cover lens (peak/apex of dome shape) |
| 26c | diameter line of cover lens = thru center point 26b. For types II-IV lighting, the diameter line shown is parallel to backlight shield 30, to vertical reflector 72, and co-planar with centerline A-A of single row 53 of secondary lenses 56 (and LEDs 54) |
| 28 | ring shield, uplight shield, or "baffle" - 28a = for types II-IV lighting; b = for type V |
| 30 | backlight shield (external on cover lens 26) Parts 30a-f except d form a vertical wall = secant across ring shield near center. (30d = generally horizontal portion of backlight shield that covers part of the ring shield opening) |
| 30a | center (short) portion of the vertical wall |
| 30b, c | end (tall) portions of the vertical wall |
| 30d | back covering (roughly horizontal part of backlight shield) = opaque covering over cover lens in back of the vertical wall parts a, b, c of the backlight shield 30 |
| 30e | reflective surface on front of vertical wall of 30. May be specular or diffuse. |
| 30f, g | top edge (30f) and bottom edge (30g) of vertical wall of 30 |
| 32 | gasket for cover lens |
| 33 | clamp to hold cover lens against gasket and light cover of lower housing |
| 34 | control chamber (houses electrical/electronic controls for LEDs) |
| 36 | light chamber (sealed chamber for LED module) |
| 37 | enclosing wall of light chamber (gasketed) |
| 38 | inside floor |
| 40 | upstanding wall |
| 44 | module mounting platform |
| 46 | heat sink fins (on upper housing 16) |
| 48 | rear box in light chamber = interface between control chamber and LED module |

-continued

| NUM. | ELEMENT |
|---|---|
| 49 | top of rear box 48 - painted white as a diffuse reflector. |
| 50 | front box in light chamber |
| 51 | top of front box 50 - painted white as a diffuse reflector. |

LED Module Assembly (52)

| NUM. | ELEMENT |
|---|---|
| 52 | LED module (assembly) |
| 52a, b | a = module with single row of LEDs (and vertical reflector) for types II-IV; b = module with 3×3 array of LEDs for type V |
| 53 | single row (of LEDs and secondary lenses). The centerline of this row's elements may be marked "A-A". Used for types II-IV. |
| {54} & 55 | 54 = LED device, or "LED" (an assembly including primary lens 55, etc., purchased as a unitary item for attachment to traces on the PCB 60) 55 = Primary Lens {LED parts 55, 80, 85-88: see combined listing after 84 below} |
| {56} | secondary lens {Sec. Lens parts 63-66, 81-84: see combined listing after 78 below} |
| 58 | module cover (58a = for types II-IV sec lenses; b = for type V) |
| 59 | recess in back of mod cover to receive sec lens flanges 64 |
| 60 | printed circuit board (PCB) |
| 61 | traces on PCB = circuit wiring (a = active for single row = types II-IV, b = active for 3×3 array = type V) |
| 62 | opening for sec lens in mod cover (a = for types II-IV; b = for type V) |
| 67 | through-holes in PCB reflector 68 for leveling bosses 65 |
| 68 | PCB reflector: Horizontal reflector on PCB 60 under sec lens 56 (incl. flanges). Any kind of reflective surface works because made diffuse by 66. |
| 68a, b | 68a = for types II-IV sec lenses; b = for type V |
| 68r | reflective surface (specular or diffuse) |
| 69 | square LED holes in PCB reflector 68 (a = for types II-IV; b = for type V) |
| 70 | horizontal flat reflector (diffuse) on top of mod cover 58 e.g., sheet of white plastic with rough surface. Same ref no. used for reflector and its reflective surface. |
| 70a, b, c | a = for types II-IV, b = for type V, c = variant reflector shape that covers whole module top for types II-IV (a is shown as covering only the most significant part) |
| 71 | opening for sec lens in horizontal top reflector 70 (a = for types II-IV; b = for type V) |
| 72 | vertical reflector |
| 72a, b | end sections (wrapped around) |
| 72c, d | vertical edges of ends |
| 72e | reflective surface on front (specular) e.g., polished aluminum |
| 72f | top/upper edge (a vertically convex curve is illustrated) |
| 72g | bracket to position and attach reflector 72 onto module 52. |
| 74 | recesses into mod mounting platform 44 to accommodate module fasteners 76 |
| 76 | module assembly fasteners, e.g., nuts, machine screws, and through holes that are used to hold the LED module 52 together in an assembled unit |
| 78 | mounting fasteners: screws, through holes, and threaded holes for mounting the assembled LED module 52 to the mounting platform 44 |
| {80} | {See LED parts after 84 below} |

Secondary Lens (56)

| NUM. | ELEMENT |
|---|---|
| 56 | secondary lens (a, b, c, d for types II-V) |
| 63 | body of sec lens 56, especially its refracting outer surface/shape (a, b, c, d for types II-V) {Note: also see Secondary Lens Surface Features after 91 below} |
| 63bh, 63fh | 63bh is the back half of secondary lens body . . . for types II-IV the rays (e.g., 91) emitted from this half are folded forward by the vertical reflector 72, thus overlaying the rays (e.g., 90) from the front half 63fh of the secondary lens body |
| 64 | flange of sec lens 56 (a, b, c, d for types II-V) |
| 65 | leveling bosses (typically four) on underside of sec reflector flanges. They pass through holes 67 in PCB reflector 68 to sit on the PCB. |
| 66 | underside of sec lens - is roughened to diffuse light passing through it and reflecting off PCB reflector 68 |
| 81 | base plane of sec lens (body and inner surface cavity) which is aligned (by way of 65) to be co-planar with the LED's emitter surface 86 (which also = hemisphere base of primary lens 55). Thus 81 is the local "horizontal" x-y plane at z = 0 for the LED lighting system source, i.e., the LED module assembly 52 including PCB, LED emitter, all lenses and reflectors. The base plane 81 also may be roughly coplanar with the vertical interface between recesses 83 and 84. |
| 82 | cavity/inner surface of sec. lens 56, fits over primary lens 55 of the LED |
| 83 | recess in sec lens to receive LED substrate 85 |
| 83a | straight side of recess to align with edge of substrate 85, however alignment to LED alignment pegs 80 may be preferred. |
| 84 | alignment recess in sec lens (fits around four LED alignment pegs 80, if present). May be stepped inward from recess 83 as shown (FIG. 7B). May be combined with 83 to make a single recess for substrate alignment. |
| 84a | straight side of recess to align with two LED alignment pegs 80. |
| {Note} | {also see Secondary Lens Surface Features after 91 below} |

LED Device/Assembly (54)

| NUM. | ELEMENT |
|---|---|
| 54 | LED device, or just "LED" (an assembly, purchased as a unitary item for attachment to traces on the PCB 60) |
| 55 | primary lens of LED (hemispherical) |

| NUM. | ELEMENT |
|---|---|
| 80 | alignment pegs of LED, raised at 4 corners around LED primary lens (also aligned with corners of square LED emitter surface and LED substrate.) |
| 81, x-y base plane | base plane of LED's emitter surface 86 (which also = hemisphere base of primary lens 55). Thus 81 is the local "horizontal" x-y plane at z = 0 for the LED device 54. We align the secondary lens and reflectors to this, making 81 the base plane of the lighting system source, i.e., the LED module assembly 52. |
| 85 | LED substrate (thin square ceramic board. The LED device parts are all mounted on it, and metal contacts on bottom are for soldering to PCB traces) |
| 86 | LED emitting surface, "emitter". Is square area "extended light source" (3 mm × 3 mm = 3 mm square). The base plane 81 of secondary lens is made to be co-planar with 86. |
| 86a, b . . . | points on the emitter surface 86 (FIGS. 13E-F) |
| 87 | LED "die" = chip with LED junctions/emitting surface covering most of it |
| 88 | phosphor to convert blue LED output to "white" light = yellowish coating on top of 86 |
| 89 | corners of LED emitter 86 |
| | Folded/Reflected Light Rays for Offset Light Pattern (FIGS. 10A-10B) |
| 90 | light ray emitted from LED and secondary lens in "forward" direction 149 (toward front/street side 136) |
| 91 | light ray emitted from LED and secondary lens in "rearward" direction 147 (toward vertical reflector 72 on back/house side 138). |
| 90a . . . i, 91a . . . i | individual rays at sequential elevation angles (as measured at sec lens surface), labeled starting with "a" at the lowest elevation angle |
| AB | downward angle of unblocked "back" lighting = angle between straight downward direction 148 and farthest extent of backlit area (as limited by vertical minor 72 and backlight shield 30 in types II-IV fixtures) |
| A(e) | downward angle of ray leaving fixture through shield ring 28. The letter "e" in parentheses is example of letter identifying the particular ray (90e or 91e). Angle is with respect to straight downward direction. |
| | Secondary Lens Surface (63) Features |
| A, B, C, G, J | inflection types and/or locations on sec lens outside surface, where slope has abrupt change = very tight curve or discontinuity = very high or infinite rate of slope change at a point surrounded by gentler curves. NOTE: the letter may indicate the location of that type of inflection even if the actual inflection is absent or not readily visible. |
| A~, B~ etc. | inverted version of Inflections A, B, etc. (FIGS. 13G-H) This happens when inflection lines cross over the J-inflection line 98. |
| 95-99 | line of same-type inflections A-J. The line passes through a series of adjacent same-type inflection points, and is orthogonal to the direction of the inflections. Inflection lines are radial or rotational. |
| radial line of inflec. | radius changes along the line, but azimuth angle stays constant. Inflections on it are horizontal/azimuthal/rotational slope changes where z-value/elevation angle doesn't change., i.e., a 2D curve in a horizontal plane. The radial lines are 95, 96, 97, and 99. |
| rotational line of infl. | (non-radial) = line w/constantly changing azimuth angle. Inflections (J) on it are vertical or elevational slope changes where azimuth angle stays constant, i.e., a 2D curve in a vertical plane. Line 98 of J inflections is only example in disclosure. |
| 96, A | "primary" radial line feature of the secondary lens' outside surface 63 (= a "ridge" that establishes "corners" for the lens) = radial line of A type inflections. Usually this is the only inflection type used on type V lenses. |
| 97, B | "secondary" radial line feature (The "triangle" or "wedge" feature is formed between this and primary line 96) = a radial line of B type inflections. If present, it only occurs on the longer lens side (as measured between corners A). |
| 98, J | oval top ridge feature (for color correction/blending) = rotational line of J type inflections. Most significant use is on high aspect ratio type II lighting. |
| 99, C | subtle mid-side radial line feature (usually like a groove) = radial line of C type inflections. Occurs on the lens side that determines pattern width W. |
| 95, G | subtle mid-side radial line feature (usually like a groove) = radial line of G type inflections. Occurs on the lens side that determines pattern length L. |
| 100 | top facet of a secondary lens adapted for color mixing by use of a ring 98 of J type inflections. Top facet is bounded inside the inflection ring 98. |
| 102 | side (or bottom) facet of secondary lens = outside of ring 98 of J type inflections. |
| 106 | apex of radial profile for a secondary lens' outside surface 63. (e.g., a ring-like top edge of "volcano" shape) |
| | Global Directions, Environment, Dimensions, Symbols, Etc. |
| X, Y, Z | 3D orthogonal (rectangular) coordinates = Global frame of reference - Relative to ground plane and location of LED lighting apparatus 10. The ground surface, idealized as planar, is the horizontal X-Y plane on which the lighting pattern 150 is specified. By convention herein, the lengthwise direction L of the pattern is made the X-axis direction, so that the widthwise pattern direction W is the Y-axis. The Z-axis is normal to the ground plane and therefor equivalent to the "straight up" or "straight down" directions (146 and 148 respectively). |
| x, y, z | 3D orthogonal (rectangular) coordinates = Local frame of reference - Relative to LED device, including its primary lens. The LED emitter surface = base plane 81 of primary lens = x-y plane at z = 0. The z axis is vertical through the center (origin x = y = 0) of emitter 86 and LED device 54 as a whole. Is a rotational/center/vertical axis of primary lens 55. By convention in this disclosure the x-axis is defined to be parallel to the line (row) 53 of LEDs. Also the 4 sides of the square emitter 86 are aligned with the x and y axes. |

-continued

| NUM. | ELEMENT |
|---|---|
| | When relating the illuminance pattern 150 created by the LED lighting apparatus on the ground, the x, y, and z-axes of the LED's local frame are considered to be aligned with the corresponding X, Y, and Z-axes of the global frame (unless stated otherwise). |
| r, θ | polar (2D) coordinates = Local frame of reference (relative to LED)<br>r = radial distance within horizontal r-θ plane centered at origin x = y = 0<br>θ (theta) = azimuth angle of rotation about origin, typically increasing in CCW direction from 0 degrees usually assigned to the (positive) x-axis or "3 o'clock".<br>cylindrical 3D coordinates add z coordinate for height of r-θ plane on center z-axis |
| ρ, θ, φ | spherical (3D) coordinates = Local frame of reference (relative to LED)<br>Rho (ρ) = radius in any 3D direction from origin at x = y = z = 0, Theta (θ) = azimuth angle, Phi (φ) = elevation angle upward from zero at base plane/equator 81. |
| 122 | pole supporting a lighting fixture/apparatus/luminaire 10 (e.g., a utility pole) |
| 124 | mounting arm for holding fixture 10 mounted on a pole 122 |
| PH | pole height (to base plane 81 of LED module 52 in fixture 10 mounted on a pole 122) |
| 136 | front, preferential side ("street side") = location relative to center of LEDs in type II-IV LED lighting apparatus 10. Sometimes stated as if it is relative to the pole 122, but this ignores the length of the mounting arm 124, and should be understood to most accurately mean "in front of the LED light source center".<br>In two dimensions on the ground, the line through the "center" is the nearest lengthwise edge of a lighting pattern (see 150) |
| 138 | back, non preferred side ("house side") = relative location, opposite of front 136 |
| 146-9 | Orthogonal directions away from LED light source using a 3D global frame of reference relative to the ground plane of the illuminance pattern 150 which contains the pattern's X and Y coordinates. The global vertical axis Z, is usually assumed to be positioned to pass through the center of the line of LEDs mounted in a fixture 10 that's mounted on pole 122.<br>By convention, when a single direction is given, that references the most meaningful component of a 3D vector. The context of the reference determines the remaining vector components. Example: reference to a "forward directed ray" may be a reference to a ray directed forward as opposed to backward. In addition the ray is probably also headed downward. It will also have a sideways directional component (longitudinally along the street) but whether to right or left doesn't matter when the illuminance pattern is symmetric to left and right of fixture. |
| 146 | Direction upward (uplight, none allowed) |
| 147 | Direction backward (backlight, limited to a specified small amount of light output) |
| 148 | Direction downward (generally assumed to be included when referring to light rays directed "forward" or "backward"). "Straight Downward 148" means purely vertical, i.e., normal to ground plane of light pattern. Also, according to our designs, is parallel to z-axis and normal to the LED base plane 81 in LED module local frame of reference. |
| 149 | Direction forward, laterally/widthwise across the street (NOTE: NOT "OUTWARD" because that term is used more generically to mean generally "away" from the LED(s) or module, or center of an LED or lens, or out from the outer lens of the fixture) |
| 150 | Illuminance Pattern, Target Area, Intensity/Light Distribution (pattern), and similar. = Intended illuminated area on the ground (idealized as planar and rectangular). Unless stated otherwise, for Type II-IV patterns it means the street side (forward) area, ignoring backlight area on house side. Specified boundaries = length L by width W. |
| 151 | front, forward-most, or widthwise far corners of pattern 150 (a "corner" is where a side having length L meets side having width W, idealized as a right angle). The line 151-151 between them is the lengthwise pattern boundary on the far side of the "street" |
| 152 | back, backward-most, or near corners of pattern 150. The line 152-152 between them is the lengthwise pattern boundary on the near side of the "street" and is usually considered the dividing line between street/front side 136 and house/back side 138. |
| L | length of light distribution/pattern, longitudinally/lengthwise along street |
| W | width of light distribution/pattern, laterally across street |
| L1, W1 | length and width of secondary lens that corresponds to L, W respectively. Note that this means that a row of LEDs/lenses extends lengthwise relative to dimensions of the lens, even though the individual lenses may be "wider" than they are "long". |
| L2, W2 | length and width of sec lens body 63 as measured between corners at outermost point of A-inflection lines 96 (FIG. 12F) |
| Lf, Wf | length, width of sec lens flanges 64 that correspond to L, L1 and W, W1 respectively. For types II-IV lenses the flanges are standardized to a single overall size. The flanges all have a "width" Wf greater than its "length" Lf (which is along length of row 53). |
| S | LED (and sec. lens) spacing (types II-IV = 25 mm ideal) This set a maximum value for flange length Lf |
| Sf | small space between flanges = tolerance allowance to assure lenses are positioned by LED, not adjacent lenses. (spacing isn't as important as lens-to-LED alignment) |
| A-A | line along centers of LEDs (and sec. lenses) in single row 53 for types II-IV |
| B-B | In FIG. 10C, line along outside edges of type II secondary lenses. Marks extent of lens width W for type II lens, which is the most narrow of the types II-IV lenses. |
| C-C | In FIG. 10C, line along outside edges of type IV secondary lenses. Marks extent of lens width W for type IV lens, which is widest of the types II-IV lenses. Thus it is used to determine width of module cover 58 lens openings 62. |
| D-D | line along reflective surface 72e parallel to top surface of module (or D'-D' with a different sec. lens) |
| SB1 | setback of 72e from centerline 53 of sec lenses (SB1' with different sec lenses) |
| SB2 | setback of 30e from 72e (FIG. 10B) |
| D5 | difference of SB1 vs. SB1' |

-continued

| NUM. | ELEMENT |
|---|---|
| D6 | distance between lines B-B and C-C = half difference between lens widths W1 of 56 vs. 56'. Is related to D5 and may be approximately equal, depending upon shape of lens side. |
| d | separation between side of lens and inside surface of reflector 72e |

In the detailed description that follows, numerous details are set forth in order to provide a thorough understanding of the present invention. It will be appreciated by those skilled in the art that variations of these specific details are possible while still achieving the results of the present invention. Well-known processing steps are generally not described in detail in order to avoid unnecessarily obfuscating the description of the present invention.

In the description that follows, exemplary dimensions may be presented for an illustrative embodiment of the invention. The dimensions should not be interpreted as limiting. They are included to provide a sense of proportion. Generally speaking, it is the relationship between various elements, where they are located, their contrasting compositions, and sometimes their relative sizes that is of significance.

In the drawings accompanying the description that follows, both reference numerals and legends (labels, text descriptions) may be used to identify elements. If legends are provided, they are intended merely as an aid to the reader, and should not in any way be interpreted as limiting.

The present disclosure most generally concerns an LED lighting apparatus designed for improved efficiency in illuminating large areas (e.g., streets and parking lots) with predefined patterns of light intensity such as the IES defined Types II, III, IV, and V illumination. The operative definition of efficiency herein includes utilization of total light energy output by the LED light source within the lighting apparatus. Utilization is reported as a percentage of the total output that falls within the predefined boundaries of the relevant type of lighting pattern, wherein any portion of the light that does not fall within the boundaries is counted as not utilized, i.e., is "wasted".

More specifically, the present invention is directed to an LED lighting apparatus with reflectors for illuminating areas with a predefined pattern of light intensity toward a preferential side of the apparatus, particularly when it is mounted on a utility pole and positioned to point a light emitting portion (light source) generally downward toward the ground. The present invention is particularly concerned with IES Types II, III, and IV lighting, e.g., street lighting for streets having different widths to be illuminated by an apparatus located at one side of the street.

As referenced herein, the LED lighting apparatus comprises an assembly of an LED light source within a housing, which may also be known as a fixture or luminaire. In accordance with common practice, the entire LED lighting apparatus may also be referred to as the "fixture" or the "luminaire", meaning the housing, with or without the LED light source, as can be determined from context.

The LED apparatus of an embodiment designed to produce Types II-IV illuminance patterns 150 incorporates a single row of LEDs, each covered by a secondary lens, all assembled as a module. A vertical reflector is disposed adjacent to the row of LEDs so that the front surface of the vertical reflector acts to help direct the light from the LEDs in the direction downward away from the LEDs and forward from the front surface of the vertical reflector.

Referring to FIG. 1, there is illustrated an LED lighting apparatus with reflectors (e.g., apparatus 10 of the present disclosure) mounted on a utility pole 122 at a pole height PH for illumination toward a "front" preferential side ("street side") 136 in a downward direction 148 and a forward direction 149 (laterally across the width of the street). Especially for (IES) types II, III, and IV lighting (types II-IV), a common application is street lighting as illustrated in FIG. 1. Thus the preferential side 136 is the "street side" of the pole 122, and the LED lighting apparatus (fixture) (e.g., fixture 10) is mounted on the preferential side and oriented such that illumination in the forward direction 149 is directed laterally across the longitudinally extending street. A non-preferred, or "back" side 138 of the fixture 10 and pole 122 is also known as the "house side", and the amount of "back illumination" is preferably minimized to avoid wasting light output relative to street lighting (type II-IV). More than a specified range and amount of backlight may be considered "nuisance" light. The herein disclosed LED lighting apparatus (fixture) 10 allows only a bare minimum amount of back illumination and substantially no "up light" (in the upward or skyward direction 146). Although not illustrated in this Figure, it will be known by one of ordinary skill in the related arts that type V illumination is for other types of lighting applications wherein the desired illuminance pattern extends in substantially all lateral and longitudinal directions on the ground under the lighting apparatus, i.e., without a "preferential side".

The LED Lighting Apparatus in General

FIG. 2 is an exploded plus an assembled three dimensional front and "bottom" view of the (inverted) LED lighting apparatus with reflectors 10, according to the present invention, wherein a back portion is not exploded, but remains closed by a controls cover 20 extending from a back end 20b to a front edge 20a thereof. In the front, a light cover 22 extends from a front end 22a to a back edge 22b which laps with the front edge 20a of the controls cover 20 when the apparatus 10 is fully assembled and closed.

Even though this is actually an inverted or upside-down view (downward direction 148 is shown as an upward pointing arrow), the majority of this disclosure will be related to similar views because most of the elements being discussed are best seen this way. In effect, the disclosure will use a local coordinate system that is inverted from the global coordinates shown in FIG. 1, and is somewhat centered on the LED light source (e.g., LED module 52) in the fixture 10. The correlation between coordinate systems should be apparent in light of the following guidelines. The global "downward" direction 148 is the direction that light emitted by the LED light sources takes as it proceeds away from the light source and out through a cover lens 26 of the fixture 10. Thus any view apparently looking "down" at the LEDs and/or the cover lens 26 and/or the bottom or lower portion 18 of the fixture 10 will use the local coordinates wherein the "downward" direction 148 equates to terms such as "up", above, away, out of, and the like. Finally, the forward direction 149 will mean toward the "front" or front end 22a of the LED lighting apparatus 10, and correspondingly, the back or backward direction 147 will mean toward the back end 20b of the fixture 10. Similarly, relative locations such as "in front of" and "behind" are correspondingly associated with the forward direction 149 and the backward direction 147, respectively.

As shown in FIGS. 2 and 3, the LED lighting apparatus 10 includes a housing 12 with external cooling fins 46 provided on an external surface of an upper portion 16 of the housing 12. A lower portion 18 of the LED lighting apparatus 10 includes a control cover 20 that covers electronics used to supply power to the LEDs and components for connection to the pole 122 to which the LED lighting apparatus 10 is attached (FIG. 1). The control cover 20 may be hingedly mounted to the housing 12 by hinges (not shown) at the back end 20b to provide easy access to the power electronics and on-site installation mechanical and electrical connections.

The lower portion 18 of the LED lighting apparatus 10 includes a hinged light cover 22 that is secured at a front side (or end) 22a to the housing 12 by hinges 24a and 24b. The opposite side, back edge 22b of the hinged light cover 22 is aligned with and abuts the front edge 20a of the control cover 20.

Referring again to FIG. 2, the hinged light cover 22 has an outer, or cover lens 26 (a.k.a. "drop lens" or "cover glass") constructed of any suitable transparent or translucent material such as glass or plastic. In the illustrated embodiment, the cover lens 26 has an outward extending convex dome shape with a centered apex (26b, see FIG. 8), and is clamped 33 under an aperture portion 22c (opening) of the light cover 22 and provided with a gasket 32 to create a watertight seal. A ring shield 28, or "uplight shield" is mounted to the light cover 22 by suitable means such as screws (not shown). A back light shield 30 is mounted over the cover lens 26 and a vertical portion 30a, 30b, 30c extends laterally across the ring shield 28. As best seen in FIG. 9, a center section 30a of back light shield 30 has a concave shape and is sized so that the center section 30a can rest upon a convex section 26a of the cover lens 26. Two end sections 30b and 30c of the vertical part of back light shield 30 extend from the center section 30a to the ring shield 28. As shown in FIG. 8 the back light shield 30 is also aligned with a vertical reflector 72 and with a row 53 of LEDs with lenses 56, both of which are on an LED module 52 that is mounted inside the housing 12. It will be seen that the back light shield 30 works with the vertical reflector 72 to direct the LED light forward (direction 149) from the module 52 disposed under (inside) the cover lens 26 and between the backlight shield 30 and a forward section of the ring shield 28 which is closer to the hinges 24 at the front end 22a of the light cover 22. A back covering portion 30d of the backlight shield 30 provides an opaque light blocking member over the area between the vertical portions of the backlight shield 30a, 30b, 30c and a rear portion of the ring shield 28 which is closer to the back edge 22b of the light cover 22.

Referring to FIG. 3, there is illustrated a three dimensional view inside of the (inverted) upper portion 16 of the housing 12 with the hinged light cover 22 removed to reveal the light chamber 36 disposed on the inside floor surface 38 of the housing 12. An upstanding wall 40 is formed about the perimeter of the floor surface 38 and provides an outside wall with support for the hinged control cover 20 and the hinged light cover 22. The control chamber 34 is a separate chamber under the control cover 20. A light chamber wall 37 surrounds the light chamber 36 and extends high enough to seal against the hinged light cover 22. A weather tight seal may be provided by positioning a gasket in a groove (not shown) around the top of the light chamber wall 37.

Within the light chamber 36 a module mounting platform 44 is disposed on the floor surface 38 (e.g., 38 and 44 molded or cast as a unitary object that also includes external heat sink fins 46). Adjacent either long side of the mounting platform 44 is disposed a rear box 48 and a forward box 50, which have covers with top surfaces 49 and 51, respectively.

The LED module 52 (see FIGS. 2 and 5) is mounted to the module mounting platform 44 between the rear box 48 and the forward box 50 using fasteners 78 that screw into threaded holes 78 in the platform 44. As shown in FIG. 8, these fasteners 78 accurately position the LED module 52 such that the vertical minor 72 is properly aligned and positioned relative to the backlight shield 30, and also position the line of LEDs 53 directly under the cover lens apex 26b thereby centering the LED light with the cover lens 26. Since the external heat sink fins 46 are integrated with the platform 44, they work together to conduct heat away from the LED module 52 and disperse it outside.

LED Module Assembly

Referring to FIGS. 4, 5 and 6, a plurality of LED devices 54 (LEDs) are aligned in a single row 53 across the length of the LED module 52. The LEDs 54 are mounted on a printed circuit board (PCB) 60 which is disposed under a module cover 58. Each of the LEDs 54 is covered by a secondary lens 56 that projects outward through an opening 62 in the module cover 58. A PCB reflector 68 provides a reflective surface 68r disposed between the printed circuit board 60 and the secondary lenses 56, and has a plurality of openings 69, each of which is sized and positioned to fit around each of the LEDs 54. The reflective surface 68r is preferably a diffuse reflector, but can be specular given another aspect of the module described further hereinbelow. (In an embodiment, the PCB reflector 68 is a thin plastic sheet that is made relatively inexpensive by using material that reflects specularly.) A flange 64 extending around the bottom of each of the secondary lenses 56 is overlapped by the module cover 58 to secure the secondary lenses 56 between the printed circuit board 60 and the module cover 58, by pressing the flanges 64 against the PCB 60, thereby holding each secondary lens 56 in position over a one of the LEDs 54.

A horizontal reflector 70 is disposed across at least a portion of the top of the module 52, preferably over all of the top that is exposed to light that can be reflected out of the apparatus 10 in which it is mounted. One or more openings 71 in the horizontal reflector 70 allow the secondary lenses 56 to protrude up through the reflector 70. In FIG. 4 an embodiment of the reflector 70 is shown having a single, slot-like opening 71, and FIG. 6 illustrates an embodiment having a plurality of openings 71, one per LED 54.

Referring also to FIGS. 5, 7 and 8, module assembly fasteners 76 (e.g., machine screw and nut in a through-hole) are spaced around the module 52 and used to hold all of the layers and parts together in a single unit, i.e., an LED module assembly 52. When a vertical reflector 72 is included, it is attached as shown in FIG. 5 wherein a bracket (mounting tab) 72g that extends at a right angle from the reflector 72 is held in place by one of the module assembly fasteners 76.

When the assembled LED module 52 is mounted on the mounting platform 44 in the fixture housing 12, recessed areas 76 accommodate the fasteners 76 where they protrude below. The module 52 is removably affixed to the platform 44 by a set of mounting fasteners 78 in through-holes 78 spaced around the module 52. Referring especially to the embodiment illustrated in FIGS. 5 and 8, the fasteners 78 are screws that pass through "keyholes" to screw into threaded holes 78 in the mounting platform 44. Use of keyhole-shaped through holes 78 allows installation/removal of the module 52 by loosening the screws 78 without needing to remove them.

LEDs and Positioning of Module Elements

Referring particularly to FIGS. 6 and 7A, component parts of the LED device 54, such as Model SST-90 from Luminous Devices Inc. (Billerica, Mass.), are illustrated in a detailed view of one that is mounted in an assembled LED module. In a vertical cross-section view passing through the center of the LED 54, an embodiment of the LED 54 is shown as a pre-assembled device that includes a square ceramic substrate 85 as the structural base of the assembly. A square LED "die" 87 is affixed on the substrate 85 and is mostly covered by an "extended area" (3 mm square) emitter (LED emitting surface) 86. For "white light" LEDs the emitter surface 86 is coated with a phosphor layer 88 that converts blue LED emissions to "white" light as it passes through the phosphor 88. Finally the phosphor coated LED die is embedded in a hemispherical "primary lens" 55 that is formed on the substrate 85. The illustrated embodiment of the LED 54 also provides raised round "alignment pegs" 80 around the primary lens 55 to define four "corners" 89 for the LED package 54. The alignment pegs 80 are positioned on corner-to-corner diagonal lines equidistant from the center of the LED, where the corners (89, not shown) are the aligned physical corners of the emitter surface 86 and of the substrate 85. In other words, moving radially outward from the origin/center of the LED emitter 86, the four corners of the square emitter 86 are aligned with the four alignment pegs 80 (if present), and with the four corners of the square substrate 85, thereby nesting them all around a common center point at the x-y-z zero point (the origin), with parallel sides of the squares.

For reference in drawings such as FIGS. 7A, 10A and 10B, a (local) rectangular coordinate system framework is established as shown in FIG. 7A. This coordinate system is relative to an LED, generally in the context shown wherein the LED is mounted in an assembled LED module 52. The x-y plane is defined as being co-planar with the surface of the LED emitter 86 and is also designated as the LED base plane 81. The x-y origin is defined to be in the base plane 81 at the geometric center of the emitter 86 and therefor is also the center of the elements of the LED device, including the primary lens 55 which is a hemisphere with its equatorial plane (base) co-planar with the base plane 81. As a result, any light ray emitted from the center of the LED emitter 86 will be a radius line of the primary lens 55, therefor impinging on the surface of the primary lens 55 at a 90 degree angle of incidence, and therefor will not be refracted away from radial as it passes through the surface. The vertical z-axis is orthogonal to x and y, and therefor is perpendicular to the base plane 81 and has its zero value at the x-y-z origin at the center of the LED emitter 86. By convention in this disclosure, as shown in FIG. 7A the x-axis is defined as being parallel to the line 53 that forms the lengthwise centerline of the straight row of LEDs 54 mounted on the PCB 60. This convention further links coordinate systems in that the row 53 of LEDs (and thus the x-axis) is aligned with the "lengthwise" direction (shown by length dimension line L) of the lighting pattern 150 emitted by the LED module 52 and established on the ground plane as shown in FIG. 1 for a properly positioned LED lighting apparatus 10 that contains the module 52 mounted therein as shown in FIG. 7. So dimensions associated with the x-axis are called "length", and correspondingly, dimensions associated with the y-axis (not illustrated but understood to be orthogonal) are called "width". Furthermore, the straight downward direction 148 is generally assumed to be parallel to the z-axis, and distances in that direction increase from z equals zero at the origin (or LED base plane 81). Given this, then y value increases (positive values) for distance from the origin in the forward direction 149, and decreases from zero (negative values) in the backward direction 147.

Referring to FIGS. 7A and 7B, details of the LED module 52 as it is assembled around an LED 54 are illustrated. The LED substrate 85 (affixed to the PCB 60) is surrounded by the PCB reflector 68 which has a square opening 69 (labeled in FIG. 4) that closely fits around the substrate 85 and lies on top of the PCB 60, loosely held there by the underside 66 of the secondary lens 56, which is raised above the PCB surface by leveling bosses 65 which preferably pass through holes 67 in the PCB reflector 68 as shown to allow direct contact of the leveling bosses 65 with the surface of the PCB 60, thereby providing the most accurate leveling. The leveling bosses 65 are thus used to align a center axis of symmetry for the secondary lens 56 with the center z-axis of the LED primary lens 55, thereby also establishing a perpendicular base plane for the secondary lens 56 that is parallel to the LED base plane 81. In addition the leveling bosses 65 position all of the secondary lenses 56 at a consistent level/height relative to the PCB 60, and thus relative to the LED emitter surface 86, thereby making the base planes of the secondary lenses 56 co-planar with the LED base plane 81.

The secondary lens 56 has a flange portion 64 and a body portion 63 distinguished by the optically designed shape/contour of its surface (also referenced as 63). The flange 64 is held down against the PCB 60 by the module cover 58 which has an opening 62 sized to accommodate the width and length of the secondary lens 56 (further discussed with reference to FIG. 10C). The ends of flanges 64 for adjacent lenses are partially shown to the right and left of the view. It may be noted that the length of the flange (measured side to side along the x-axis) is determined by the LED 54 spacing along the row 53, which in turn is dictated by the optical design for the secondary lenses 56. Since each secondary lens 56 is individually positioned by its associated LED 55, the side-to-side length of the flanges 64 must be less than the nominal LED spacing in order to avoid having a lens 56 interfere with the alignment of an adjacent lens 56. The horizontal reflector 70 also has an opening 71 for the secondary lens 56, and the opening 71 may be sized and shaped differently than the opening 62 as described elsewhere herein.

Reflectors

The LED module 52 is designed to flexibly accommodate both types II-IV and type V lighting. First we will discuss designs for the forward-directed lighting patterns of types II-IV (offset to a preferential side).

For example, the assembled module 52 illustrated at the bottom of FIG. 4 is a type II-IV variety of module 52a which includes a vertical reflector 72 that reflects LED light forward (direction 149) rather than allowing light to pass back behind it. Therefor, the horizontal reflector 70 need only cover the portion of the module 52 that is forward 149 from the vertical reflector 72. The horizontal reflector 70 is a diffuse reflector, and can be of any suitable material such as a reflective adhesive tape, a sheet of reflective material (e.g., textured aluminum foil), a white plastic sheet with a rough surface, a painted module cover surface, or any other suitable diffusely reflective material. A sheet of material may be used for best efficiency because it can overlap parts of the module that aren't covered by the module cover 58. For example, FIGS. 4 and 5 show a horizontal reflector 70 that abuts sides of the secondary lens 56 for a close fit, while FIG. 10C shows why a universal module cover 58 may not be able to cover all of the flange 64 for some types of lenses 56. It is simpler and less expensive to stock a single module cover 58 plus a plurality of horizontal reflectors 70 to enable manufacture of all types II-IV module assemblies 52.

An example of a suitable material for the horizontal reflector 70 is used in an embodiment wherein a PET plastic sheet having a "micro cellular" structure makes a good diffuse reflector due to open cells that create many pores in the white surface, which is thus roughened.

FIGS. 3 and 9 show that the front box 50 in the light chamber 36 is also exposed to light that can be reflected back inward by the cover lens 26, therefore it is also given a diffusely reflective surface 51. For example, a suitable paint (e.g., matte white) may be used to form the horizontal surface reflector 51.

Furthermore, for LED lighting apparatuses 10 that may not have a shield (e.g., backlight shield 30) covering part of the cover lens 26, or if a vertical reflector 72 is not being used, then additional reflective surfaces may be desirable according to the presently disclosed design principles. For example, a type V LED lighting apparatus 10 will not have a vertical minor 72 or a backlight shield 30, so that the entire light cover opening 22c will be used. In such a fixture, then, the horizontal reflector 70 covers the entire top of the LED module 52, and the rear box 48 (see FIG. 3) is given a diffusely reflective top 49 like that of the top 51 of front box 50.

In general, all of the horizontal reflectors 70, 68, 51 and 49 are designed to diffusely reflect because the stray light that they handle most likely comes from Fresnel reflections (in cover lens 26 or secondary lens 56), or possibly reflection from various inside surfaces of the light chamber 36. Most likely such reflected light "rays" will be directed at a low angle toward enclosed side portions of the light chamber 36 or under the module cover 58, so specular reflection off of a horizontal reflector would lead to trapping such light rays, thereby wasting their light. A diffuse reflection, however, will redirect the light rays to a variety of directions that are much less affected by the incident angle, resulting in a much higher percentage of the reflected light being passed back out through the cover lens 26 in the opening 22c of the light chamber 36.

Referring to FIGS. 5 and 7, there is illustrated an elongated vertical reflector 72 which is disposed adjacent and parallel to the line 53 (marked A-A) of secondary lenses 56 (on LEDs 54) and has an upper edge 72f contoured to the shape of the cover lens 26 as shown in FIG. 7. In the embodiment having a cover lens 26 with a concave inner shape, the upper edge 72f of the reflector 72 has a corresponding convex shape that follows the inside surface of the cover lens 26. As shown in FIGS. 5 and 10A, the vertical reflector 72 may be spaced a distance "d" of between 0 to 6 mm, and preferably between 0.25 mm to 1.0 mm from the closest surface of the secondary lenses 56. The vertical reflector 72 can be constructed of any rigid, heat resistant material such as for example, steel, aluminum, copper, plastic, etc., which is provided with a specular reflective front surface 72e facing the line 53 of secondary lenses 56. For example, a high reflectance polished aluminum "mirror" may be used. End sections 72a and 72b of the reflector 72 are curved towards the line 53 of secondary lenses 56 at each end of the row 53 and wrap around the row-end lenses 56 to a vertical end edge 72c, 72d at about the centerline A-A which is through the center of the line or row 53 of secondary lenses 56 and LEDs 54.

The reflective front surface 72e of the vertical reflector 72 is disposed adjacent to the row 53 of LEDs 54 to reflect backlight from the LEDs towards the forward 149 and downward 148 directions away from the LEDs, i.e., downward 148 towards the cover lens 26 and forward 149 from the front surface 72e of the vertical reflector 72. Furthermore, it can be seen that the curved end sections 72a and 72b will help to appropriately redirect light emitted at low angles from the ends of the line 53 of LEDs 54. The action of the vertical reflector 72 will be discussed in detail hereinbelow with particular reference to FIGS. 10A and 10B.

Some light from the LEDs 54 may be refracted and/or reflected back toward the LED module 52 (e.g., Fresnel reflection by the cover lens 26), therefor the horizontal flat diffuse reflector 70 across the top of the module cover 58 works in combination with the vertical reflector 72 to direct as much as possible of the light from the LEDs 54 into the desired downward direction 148 away from the LEDs 54 and horizontal reflector 70, and into the forward direction 149 away from the front surface 72e of the vertical reflector, i.e., toward the preferred side (front 136) of the LED apparatus 10.

As seen in FIGS. 6 and 7A, the printed circuit board (PCB) 60 is disposed under the module cover 58 (e.g., within a surrounding sidewall, not detailed). A row 53 of a plurality of openings 62 are formed through module cover 58 to receive secondary lenses 56. The flange 64 extending around the bottom of each of the secondary lenses 56 is overlapped by the module cover 58 beyond the opening 62 and thereby secured in place. The horizontal reflector 70 has a corresponding plurality of openings 71 that may match the dimensions of the openings 62 (as in FIG. 6), or may be sized to closely surround the sides of each secondary lens 56 as shown and described hereinabove with reference to FIG. 4.

A horizontal PCB reflector 68 is placed between the secondary lenses 56 and the PCB 60 to reflect any light that bounces downward (e.g., by Fresnel reflections in the primary lens 55 and/or the secondary lens 56). The PCB reflector 68 should be a diffuse reflector, but a non-diffuse reflective material may be thinner and less expensive, therefore the underside surface 66 of the secondary lens 56 is roughened (see FIG. 7B) so that light passing through the underside 66 to and from the reflector 68 will be diffused. A textured bottom surface 66 may be achieved, for example, by etching it; or for example, by bead blasting a mold insert used to mold the lens 56. As an example of an inexpensive material for use in the PCB reflector 68 a polyester reflective film may be used.

Referring again to FIG. 7, there is illustrated a cross sectional view along line 7-7 of FIG. 9. The row 53 of LEDs 54 is shown mounted to the printed circuit board 60 and covered by a secondary lens 56. As shown in FIG. 7A, each secondary lens 56 is held in place by the module cover 58 to make an assembled LED module 52 (see FIG. 4) which is held together by fasteners 76. Then the LED module 52 is mounted to the module mounting platform 44 using screws 78 into threaded holes 78 in the platform 44 as shown in FIG. 8. The mounting platform 44 conducts heat from the LED module 52 to the heat sink fins 46 which, for optimal thermal conductivity are positioned immediately above corresponding ones of the LEDs 54. (Note: the word "above" in the present context refers to the global upward direction 146, which is illustrated here in a fixture 10 that is shown inverted.)

Vertical Reflector Details

FIG. 7 also shows the vertical reflector 72 as being disposed behind the row 53 of LEDs 54 with its upper edge 72f disposed under the cover lens 26 and having a shape that follows the inner curve of the lens 26 and is spaced equidistant therefrom, preferably as close as possible given normal manufacturing tolerances, plus allowance for thermal expansion. For example it is within the terms of the present embodiment to space the upper edge 72f of the vertical reflector a distance of between 0 mm to about 3 mm and preferably about 1 mm to about 2 mm from the surface of the inner curve of the cover lens 26. In another embodiment, the height of the vertical reflector 72 is a large fraction of the space between the mounted module (e.g., surface of horizontal reflector 70) and the inner curve of the lens 26, for example 96 to 99%, preferably about 97 to 98%.

Referring to FIGS. 8 and 10A-10B, the vertical reflector 72 is disposed in parallel alignment with the backlight shield 30, and either directly under it or preferably forward of it a distance labeled shield setback SB2. With this structural arrangement, most light from the row 53 of LEDs 54 is directed downward 148 and forward 149 (toward the front end 22a, street side 136 of the LED apparatus 10). Except for a limited portion of the emitted light that passes over a top edge 30f of the backlight shield 30, the backward-directed light 91 from the LEDs 54 is re-directed forward 149 (and downward 148) by a reflective surface 72e of the vertical reflector 72 inside the cover lens 26, and by a reflective surface 30e of the backlight shield 30 outside of the cover lens 26.

As shown in FIGS. 8 and 9, an extra covering 30d, preferably opaque to prevent any stray light from the LEDs 54 from going in the backward direction 147, is disposed over the cover lens 26 to block the opening 22c of the light cover 22 behind (147) the backlight shield 30. For convenience in assembly, the extra covering 30d may be integral with the vertical parts (30a, 30b, and 30c) of the backlight shield 30, and most preferably also integral with the ring/uplight shield 28.

Referring to FIGS. 10A and 10B, there is illustrated a variety of light "rays" 90, 91 emitted by the emitter 86 of the LED 54, then passing through the color correction phosphor 88, the primary lens 55 and the secondary lens 56 to its surface 63 where the ray is refracted according to the shape of the secondary lens surface 63. FIG. 10A is a cross-section view taken along the line 10A shown in FIGS. 7 and 9, and shows the vertical reflector 72 behind the LED 54 at the reflector's greatest height (to top edge 72f) as allowed by the cover lens 26. FIG. 10B is a similar view taken along the line 10B in FIGS. 7 and 9, and shows the vertical reflector 72 at its lowest height, again as allowed by the cover lens 26. Both FIGS. 10A and 10B are essentially a magnified portion of the fully assembled LED lighting apparatus 10 as indicated by the dashed-line circle in FIG. 8 (platform 44 and screw 76 details omitted).

The light beams/rays 90, 91 are individually referenced using lower case letter suffixes, starting at "a" (90a, 91a) for the lowest elevation angle and increasing with elevation angle to "j" (90j, 91j being emitted at close to a 90 degree elevation angle). The rays 90 which are emitted in the forward direction 149 are refracted at the "front half" surface 63fh of the secondary lens 56 but generally continue in the forward direction 149. The rays 91 which are emitted in the backward direction 147 are refracted at the "back half" surface 63bh of the secondary lens 56 and continue toward the vertical reflector 72, where most of the rays 91 reflect off of the reflective surface 72e (a specular reflection) to be re-directed in the forward direction 149.

Because of the geometry, including a limited overall height to the top 30f of the backlight shield and a setback distance SB1+SB2 (for the top edge 30f), plus a reflector 72 height to top edge 72f that is limited by the cover lens 26, some of the backward directed light rays 91 escape without reflection. First considering the vertical reflector 72, FIG. 10A shows that ray 91g just passes over the top edge 72f in the backward direction 147 where light is to be minimized. Ideally the vertical reflector 72 is adjusted to an optimum setback distance SB1 which is determined by tracing the path of a ray 91a which emerges from the secondary lens 56 just above the openings 71 and 62 in the horizontal reflector 70 and the module cover 58, respectively. The reflector 72 is moved toward the lens 56 and stopped just before the reflected portion of the ray 91a would be intercepted by the lens 56. At this point the reflector 72 can be locked in place (e.g., by tightening the screws 76). The separation "d" between the reflector surface 72e and the side of the secondary lens 56 can also be used to define the reflector setback distance. Although this measurement is more intuitive, it is more difficult to accurately determine due to the curved shape of the lens. Using a reflector setback distance SB1 determined as described should maximize the amount of light that will be reflected in a forward direction 149 (for a given reflector height). For example, ray 91g which just barely passes over the top edge 72f is at a relatively high elevation angle, and it can be seen that moving the reflector 72 to the left (increasing the setback SB1) will allow progressively more light at lower elevation angles to escape, thereby lowering the efficiency of lighting the forward-located (preferential side 136) lighting pattern 150 by effectively "losing" more light to the back-light which falls on the house side 138 of the light source 10.

It can be seen that, like increasing setback distance SB1, reducing the height (to 72f) of the vertical reflector 72 has the same effect in terms of decreasing the portion of LED light output that is reflected. Since the cover lens 26 is curved, the height of the reflector 72f behind an LED 54 is necessarily lower for LEDs that are located further from the center of the line 53 of LEDs. Our design compensates for this by adding a second vertical reflector (reflective surface 30e of backlight shield 30) above the cover lens 26 and shaping it to effectively maintain a constant reflector height (to 30f) fir all of the LEDs 54. Referring to FIG. 7, the vertical wall portions 30a-30c of the backlight shield 30 are shown as portion 30a near the center where it is the shortest height to its top edge 30f; and the tall portions on either side are 30a and 30b. FIG. 10A shows that the short portion 30a adds a little bit to the combined reflector height up to 30f, so that it catches and reflects rays like 91g that pass over the vertical reflector top 72f. Because it's not much higher, the ray 91h that just barely passes over the shield top 30f is only slightly higher angled. Since the edge 30f is at a constant height the back angle AB of ray 91h is the angle for all of the light that escapes the fixture 10 as "backlight".

It should be noted that generally speaking, a backlight shield on a street lighting fixture is not a new concept. They may be given a diffusely reflecting, or even a non-reflecting surface, because the main concern is to shield the back, house side 138 from excessive light levels. Especially in fixtures having a large spread-out light source such as an HID lamp, a specular reflection outside the fixture should be avoided due to glare and hot spots that would occur in many different directions depending upon a light beam's source location (the large source is not controlled by close-in lenses, so it comes out at many different angles).

In our new design the backlight shield concept has been adapted to take advantage of the better-controlled light source (the light hitting our shield 30 is all coming from a very narrow line at a known angle predetermined by the lens design.) Thus glare is much less of a concern for our design. The scope of our invention includes both diffuse and specular reflective surfaces 30e on the vertical wall portions of the backlight shield 30. A specular reflection is illustrated and described herein, however it can be seen that a diffuse reflector 30e would produce similar effects but would spread out the reflected rays somewhat, thereby diffusing (defocusing) their contributions to different spots in the lighting pattern 150. Notably, the diffusely reflected rays will not significantly go outside of the pattern boundaries because they are still limited by the top edge 30f of the backlight shield 30 and of the shield ring 28 (which also may have a specular or diffusely reflective surface).

FIG. 10B (a cross-section taken on the line 10B in FIG. 7) illustrates our compensation method applied to light emitted by one of the LEDs 54 located at the end portion 72b of the vertical reflector where it is at its shortest height to 72f. The corresponding backlight shield end portion 30b is at its tallest height to 30f (the shield vertical height being measured between the fixed height, straight top edge 30f and the curved lowest edge 30g located at the top of the cover lens 26). We see that the ray 91f, which reflected off the reflector 72 in FIG. 10A, now passes over the top edge 72f and must be reflected instead by the backlight shield 30, which has been positioned to catch that ray at its bottom edge 30g. As in FIG. 10A, we still see ray 91g being reflected near the top edge 30f while 91h is the first ray to pass over it. All rays at a lower elevation angle than 91f are reflected from the reflector 72 same as anywhere else along the line 53 of LEDs.

It can also be seen that, unlike ray 91f in FIG. 10B, the ray 91g, which in FIG. 10A also just passes the top 72f of reflector 72, does not hit the bottom corner 30g of shield 30. This is because ray 91g is at a higher elevation angle than ray 91f. If the shield 30 was moved to the right (decreasing the shield setback distance SB2) enough to cause ray 91g to hit the bottom corner 30g of the shield 30, then ray 91f would dive underneath the cover portion 30d of the backlight shield and be completely lost, trapped in the covered part of the fixture. That would also happen for all light rays 91 that have elevation angles between those of 91f and 91g. This is why the optimum shield setback distance SB2 is determined where the reflector 72 is at its lowest height as in FIG. 10B.

As a practical matter, the shield setback SB2 may be set to approximate the ideal by using a single distance for all lens variations II-IV, for example using an average value or the maximum value.

With this structural arrangement, most light from the row 53 of LEDs 54 is directed downward 148 and forward 149 (toward the front end 22a, street side 136 of the LED apparatus 10). The light that remains backward directed is "backlight" within a back angle AB, the amount of which is controlled by the combined height of reflector 72 and backlight shield 30 to the shield's top edge 30f. The back angle AB is thus controlled to restrict the area of backlighting to be within the pattern boundaries of the designed-for illumination type (II, III, or IV).

FIG. 10C uses superimposed views of modules with two different secondary lens 56 types to illustrate the point that, if the reflector setback SB1 is determined by the method described above (minimizing the distance d from the side of the secondary lens 56), then SB1 will vary in accordance with the secondary lens 56 being used. Otherwise, the LED module 52 is the same for all types II-IV. For example the lens 56 on left side of FIG. 10C extends laterally to a line C-C which is much farther out than the line B-B established by the lateral extent of lenses 56'. Using the optimum setback for each lens will therefor place the left reflector 72 at the setback distance SB1 from centerline A-A (row 53) to the reflector surface 72e at the line D-D; whereas the right-hand reflector 72' is at the setback distance SB1' from centerline A-A (row 53) to the reflector surface 72e' at the line D'-D'. They are at locations spaced a distance D5 apart, which is probably close to equal the difference D6 between the lens sides.

In addition, since the backlight shield setback SB2 is relative to the reflector 72 position at a setback SB1, there may be correspondingly different backlight shields 30 used.

Although the reflector setback SB1 optimum distance may be different for different lenses 56, the vertical reflector 72 can be given a single fixed location SB1 for the sake of manufacturing convenience and efficiency (e.g., by locating a through-hole instead of an adjustment slot in the bracket 72g which is held by module assembly fastener 76 (compare FIG. 4 to FIG. 5). This would mean that, aside from changing the secondary lenses 56, only one set of parts, including vertical reflector 72 and backlight shield 30, and only one part positioning setting, could be used for any of the type II-IV LED lighting apparatus' 10 (although it may be desirable to use different horizontal reflectors 70 as described hereinabove).

For example, to accomplish this, the fixed reflector setback SB1 may be an average of the setback SB1 values determined for a range of lens types; and there may be a single shield 30 which has been optimized to provide the most benefit to the most-used secondary lens 56 types.

Other criteria may be used for determining the setback distances SB1 and SB2. For example, the vertical reflector 72 may be positioned/shaped/angled to produce a particular pattern of light intensity 150 on the ground plane below.

Secondary Lens Design for Reflector Optics

Type II-IV distributions require most of the light to be projected on the front side 136 of the LED lighting apparatus 10 on a pole 122. The present design uses a back reflector to reflect nearly half of the emitted LED light forward. As detailed above, the position of our back reflector (72 and 30) is optimized to maximize reflection of near vertical rays (e.g., 91a-91g) but not too close as to have rays reflect back into the secondary lens (e.g., ray 91a which just meets this criterion).

By adding a vertical back reflector 72 (and 30) to an LED and secondary lens, we are able to make the present LED lighting apparatus embodiment 10, which produces a desired asymmetric light distribution pattern 150, while using symmetrical freeform secondary lens shapes 63 which are much less complicated than asymmetric freeform lenses. In particular, the lens 63 has two-axis orthogonal symmetry, meaning that any quadrant is perpendicularly reflected across the x-z and also the y-z planes of the orthogonal x-y-z coordinate system. (This kind of symmetry is a subset of 180 degree rotational symmetry about the z-axis.) As a result of this symmetry, which is matched by the symmetry of the (square) extended area LED light source, our lens shape is repeated in every x-y quadrant and therefor the entire secondary lens is designed by copying the design process performed for all of the light from the source that passes through just one quarter (one quadrant) of the lens' surface 63. (Every quadrant is repeated in an adjacent quadrant by being reflected across the x-z plane or y-z plane that lies between them. This also means that diagonally-opposed quadrants are "repeated" by simply rotating 180 degrees around the z-axis.)

Prior art typically uses an array of asymmetrical lenses to direct most of the light forward, and/or may add a short shield or reflector behind or around each LED to assist. It must be short to avoid blocking light from other LEDs in their array. Our back (vertical) reflector 72 is much taller so that it can re-direct light forward by reflection instead of by asymmetric refraction. An asymmetrical distribution could also be formed with multiple rows of LEDs with symmetrical lenses, but the tall mirror (back reflector) from one row would block light from an adjacent row unless the rows were widely spaced apart, yielding a larger fixture.

Referring again to FIG. 10A, we can see how this is accomplished.

The center z-axis of the LED 54 (and secondary lens 56) is shown in the center of the drawing, and as described hereinabove (see FIG. 7A and description) we have defined the local rectangular coordinate system such that the base plane at z=0 is coplanar with the LED emitter 86 and the origin (0, 0, 0) is at the center of it. The x-axis (not labeled in this figure) is co-linear (describes the same line) with the line 53 of LEDs which is defined to be parallel to the vertically extending planes of the reflective surfaces 72e and 30e. If we align the z-axis with the straight-downward direction 148, then it will equate to an orthogonal Z-axis of the ground plane of the illuminance pattern 150, wherein we define the X-axis in the ground plane (or pattern 150) as extending lengthwise of the pattern and the Y-axis thereof as extending widthwise of the pattern. Finally, by convention we align the LED x-axis with the pattern X-axis, and the LED y-axis with the pattern Y-axis. This means that the y-axis is parallel to the (widthwise) backward-forward line 147-149, and we define the y distances from the origin in the LED to increase positively in the forward direction 149, and decrease negatively in the backward direction 147.

The forward directed rays 90a-90f proceed from the front half surface 63fh in various elevation angle directions as determined by the shape (surface contour) of the secondary lens body 63 and will strike the ground plane at the same angles to form an illuminance pattern 150 determined by the density of rays 90 striking each unit area. The pattern along a single widthwise line is illustrated on the two 147-149 widthwise lines where the density in one dimension shows as relative spacing of the points where the rays intersect the lines. Ray 90a intersects the lower line at point 90a indicated by a circle. The ray 90b intersection is a square, 90c a triangle, and 90d a diamond. On the upper line rays 90e and 90f intersect at a filled diamond and a filled square, respectively. The horizontal spacing of these intersection points as illustrated is non-uniform and therefore represents a non-uniform distribution of light intensity (illuminance, brightness) in the pattern along that line. (This pattern of intensity distribution is according to the arbitrary lens shape 63 used in the drawing to illustrate general concepts. A properly shaped secondary lens 56 will most likely produce a uniform distribution.)

The rearward directed rays 91a-91f proceed from the back half lens surface 63bh in various elevation angle directions as determined by the shape (surface contour) of the secondary lens body 63, are reflected by the specular reflective surface 72e to the same elevation angle but headed in the forward direction 149, and will strike the ground plane at the same angles with an illuminance pattern determined by the density of rays 91 striking each unit area. The pattern along a single line is illustrated on the two 147-149 widthwise lines where the density shows as relative spacing of the points where the rays intersect the lines. Ray 91a intersects the lower line at point 91a indicated by a circle. The ray 91b intersection is a square, 91c a triangle, and 91d a diamond. On the upper line rays 91e and 91f intersect at a filled diamond and a filled square, respectively.

Since the drawing illustrates rays leaving the center point of the emitter 86 at the same elevation angles for the front half rays 90 and back half rays 91, and further given that the lens 56 is shown as being orthogonally symmetric (i.e., a minor image) across the central x-z plane, then simple trigonometry dictates that each of the rearward directed rays 91a-91f leaving the surface 63bh will likewise be minor images of the corresponding forward directed rays 90a-90f, until the rays 91 hit the reflector surface 72e. Furthermore, assuming a perfect specular surface reflection at 72e, then the rays 91a-91f after reflection will be forward-directed and parallel to their corresponding forward-directed rays 90a-90f. This fact is illustrated by the horizontal intersection points wherein it can be seen that each 90 ray intersection is the same distance forward from its corresponding reflected 91 ray intersection (distance between circles=distance between squares=distance between triangles=etc. to . . . =distance between filled squares.) The trigonometry also dictates that this constant front ray 90-to-reflected-back-ray 91 horizontal spacing is equal to twice the reflector setback distance SB1. This means that whatever widthwise illuminance pattern is created on the ground plane X-Y by the front rays 90 emanating from the lens front half surface 63fh, will be replicated by the reflected back rays 91 emanating from the lens back half surface 63bh but shifted widthwise backward (147) on the ground by a distance of two times the reflector setback SB1. Since the magnitude of the setback SB1 is around 20 mm compared to a typical pattern width W of at least 17,500 mm (pole height PH=10 meters), the overlapping shift of the two equal light intensity patterns will be imperceptible, and will even help by slightly smoothing out intensity changes in the combined light distribution pattern 150.

It can be seen that the same principles apply to the effect on the pattern 150 due to row 53 of lengthwise (x) spaced-apart LEDs with secondary lenses 56. For example, a row of nine lenses spaced 25 mm on center will have one centered pattern extending +/−(L/2) distance from a lengthwise pattern center X=0, overlapped by 4 duplicated patterns in each +/−lengthwise (X) direction, and each overlapping pattern will be shifted 25 mm on the ground relative to the pattern that it overlaps. The cumulative effect is that the overall combined illuminance pattern 150 will be extended in length by 4×25=100 mm on each lengthwise end to make the pattern length=L+2×100 mm. Given that the Type II-IV patterns are all specified to have 6 PH length, then for a 10 m pole height PH, the overall pattern length will in effect be uniformly stretched from 60,000 mm to 60,200 mm long. Again the effect will not be perceptible other than a small amount of smoothing of light intensity transitions.

Finally, since the back half body shape 63bh and front half body shape 63fh of the secondary lenses 56 are orthogonally symmetric across the x-z plane (i.e., front to back), then whatever shape the lens front surface 63fh is given as it wraps around (into the page) from the y-z plane (of the paper), will be mirrored for the lens back surface 63bh. Furthermore, since we also make our secondary lens 56 orthogonally symmetric across the y-z plane (e.g., into, versus out-of the plane of the page) then if we designate the x direction into the page as "to the right", then the "left" half of the lens surface 63 will be a lengthwise mirror image of the right half. Due to our symmetry then, a "front side" ray 90 having any azimuth angle in the "front" 180 degree range will have a corresponding back-to-front mirrored and forward-reflected "back-side" ray 91 that is parallel and offset widthwise by a fixed distance of twice the reflector setback distance SB1. Since the rays 90 and reflected-91 are parallel, their horizontal separation distance will be constant for any plane normal to the z-axis, regardless of z-value distance (i.e., height above the ground), even though the length L and width W of the pattern 150 on the ground increases as the height increases. In other words, comparing ray 90e to ray 90f we can easily see that they radiate at different forward angles A (noting that the angle A(e) is illustrated and angle A(f) for ray 90f is obviously a smaller angle). This means that the two rays are diverging as can be seen by comparing the separation of their intersections with the lower horizontal line 147-149 versus the separation of their intersections with the upper horizontal line.

Consider a rectangular target portion of a Type II-IV lighting pattern 150 (see FIG. 1), which has a horizontal rectangular target area of width W and length L (measured along an X-axis and a Y-axis, respectively, of the pattern), wherein the target is offset entirely in the positive Y (widthwise) direction from a vertical Z-axis of the pattern that extends in the straight upward direction 146 (straight downward direction 148) from the center of a light source (e.g., LED 54 with secondary lens 56) in the lighting apparatus 10 mounted on a pole 122. For prior art lighting apparatus that does not use a vertical reflector (such as our reflector 72), the LED lens must be orthogonally asymmetric across the x-Z plane at y=zero. For example, if the LED z-axis is directed straight downward 148, then the lens front half body 63fh may direct the front rays 90 to desired locations in the offset pattern target area, but the back half body 63bh must be shaped radically different in order to refract even a portion of the LED's back rays 91 to a forward direction 149. Alternatively, the base plane 81 of the LED(s) can be tilted relative to the pattern Z-axis in order to direct its z-axis forward into the target area 150. In this case, if a front-back symmetric lens is used, then the distance traveled from LED to the target (rho in polar coordinates) by each forward directed front ray 90 will be greater than that of a corresponding back ray 91. Because of this asymmetric widthwise variation of distances (rho), the front rays 90 will be more spread apart along the target Y direction than their corresponding back rays 91, thereby creating a non-uniform light intensity distribution pattern 150 wherein the intensity is greatest at the near edge 152-152 (e.g., Y=−W/2), and least at the far edge 151-151 (e.g., Y=+W/2). To correct this, the rear half of the lens must be given a different shape 63bh than for the front half 63fh, again making the secondary lens orthogonally asymmetric front to back (across the x-z plane) even though it could be orthogonally symmetric lengthwise (across the y-z plane).

So it can be seen that our LED light source module 52 which includes a vertical back reflector 72 enables us to use a single row of one or more LEDs 54 covered by secondary lenses 56, each of which has two-axis (x and y) orthogonal symmetry and a center vertical axis z which is aimed straight downward 148 to the widthwise back edge 152-152 of an illuminance pattern 150; and even though the pattern is specified to be offset to a preferential side (front 136) of the lens covered LED(s) 54 in the light source module 52, we attain a high degree of uniformity in illuminance (light intensity, brightness) throughout the offset pattern area.

CONCLUSION

According to the present embodiment, a benefit is achieved from a single row 53 of LEDs 54. It is enabled by the unique design of the free form optics of the secondary lenses 56 to allow tight spacing and the use of the single back reflector 72 (and 30) separate from the lens 56 but still placed relatively close to the lens for efficiently redirecting the backlight forward.

Another benefit of the present embodiment of a single row of LEDs 54, as compared to LEDs in multiple rows, is that it allows for a more compact fixture 10 because multiple rows would need to be spaced quite far apart to assure that one row's reflector did not impede the light path of another row.

In an embodiment, the benefit of additional efficiency is provided by extending the vertical plane of the single back reflector 72 outside of the cover lens 26, using a backlight shield 30 having a reflective vertical front surface 30e. The cover lens thickness is compensated for by setting the backlight shield 30 further back than the back reflector 72. Thus even a simple but strong convex domed cover lens 26 can be accommodated and still provide a straight-line edge at a fixed back angle AB for a controlled amount of backlight on the ground toward the house side 138 of fixture 10. As shown in FIG. 7, the backlight shield 30 has a concave section which fits over the convex cover lens 26. The center 30a of the backlight shield has the least height to the top edge 30f and a progressively higher portion in sections 30b and 30c to either side. This shape corresponds to the vertical reflector 72 where the convex upper edge 72f is the highest at the center and decreases toward the end sections 72a, 72b. Thus the shorter parts of the vertical reflector 72 are continued by the correspondingly taller end portions 30b and 30c of the backlight shield 30.

Type II-IV distributions require most of the light to be projected on the front side 136 of the LED lighting apparatus 10 on a pole 122. The present design uses a back reflector to reflect nearly ½ of the emitted LED light forward. The position of this back reflector is chosen to maximize reflection of near vertical rays, but not too close as to have rays reflect back into the secondary lens (see ray 91a which just meets this criterion).

By adding a vertical back reflector 72 (and 30) to an LED and secondary lens, we are able to make the present LED lighting apparatus embodiment 10, which produces a specified offset light distribution pattern 150 with a high degree of illuminance uniformity, while using symmetrical freeform secondary lens shapes 63 which are much less complicated than asymmetric freeform lenses. In an optimized embodiment, the lens 63 has two-axis orthogonal symmetry, meaning that any lens quadrant is perpendicularly reflected across both the x-z and the y-z planes of the orthogonal x-y-z coordinate system. As a result, our lens shape is repeated in every x-y quadrant and only needs to be designed for the light passing through one quarter of the lens' surface 63.

Prior art typically uses an array of asymmetrical lenses to direct most of the light forward, and/or may add a short shield or reflector behind or around each individual LED to assist. It must be short to avoid blocking light from other LEDs in their array, whereas our back (vertical) reflector 72 used with symmetric lenses 56 can be (and is) much taller so that it can re-direct light forward while minimizing back light and lost light.

There are several papers describing creating free form lenses for LED illumination optics, but they are all based on calculations that treat the LED as a point source and furthermore create generally round (circle or oval) light distributions (illuminance patterns 150). The present lenses 56 are based on calculations using light emitted from the entire two dimensional emitting surface of a large LED (e.g., 3 mm square), i.e., an "extended source". Among other advantages, this design method produces more efficient and effective lenses, thereby enabling production of lenses small enough so that only one row 53 is necessary to create the desired illuminance pattern.

Added Notes and Info

This detailed description is focused on providing support for claims regarding certain aspects of a newly designed LED Lighting Apparatus that incorporates many improvements on the prior art in order to meet the "desires" and objectives stated hereinabove, especially in the Background section. The following table (copied from the provisional application Ser. No. 61/490,278 filed May 26, 2011 that benefits the present utility application) provides the reader with an overview that summarizes the more notable aspects, i.e., the features presently believed to have the most potential for claims of novel and non-obvious inventions. Although this table is also "incorporated by reference" it is literally presented here as a readily available aid to further clarify the reader's understanding of the present claims to a specific feature, given that individual features function synergistically with other features within the context of the entire newly designed LED Lighting Apparatus. It may be noted that the features being claimed in a particular Docket's application are listed according to the plans in place at the time this table was presented in the provisional application, therefor the utility applications may implement them in differently labeled Dockets. For example, the utility applications for (Ser. No. 13/588,992 filed Aug. 17, 2012) and 113 (Ser. No. 13/483,045 filed May 29, 2012) are filed with some of the listed features being switched between the Dockets.

| ITEM | DOCKET | POTENTIALLY CLAIMABLE (summarized) |
|---|---|---|
| 1 | 13/558,992 | LED LIGHTING APPARATUS WITH REFLECTORS<br>Single row of LEDs (types II-IV) with close vertical reflector (specular)<br>Also horizontal reflectors (diffuse) in several places. |
| 2 | 61/511,085 | EXTENDED LED LIGHT SOURCE WITH OPTIMIZED FREE-FORM OPTICS<br>Lens designs create rectangular (includes square) distribution optimized for use with an extended LED source |
| 3 | 13/557,207 | EXTENDED LED LIGHT SOURCE WITH COLOR DISTRIBUTION CORRECTING OPTICS<br>Lens design mixes colors to prevent noticeable color gradient in light pattern (from extended LED source) |
| 4 | 61/511,085 | ASPHERICAL INNER SURFACE FOR LED SECONDARY LENS<br>a) Lens design has aspheric inner curve to minimize Fresnel losses (from extended LED source)<br>b) Lens has aspheric inner curve to improve distribution uniformity (from extended LED source) |
| 5 | 13/482,045 | BACK REFLECTOR OPTIMIZED FOR LED LIGHTING FIXTURE<br>Vertical reflector has wrapped ends and arched top edge to maximize forward lighting with a shallow cover lens to create a compact fixture.<br>Backlight shield outside cover lens is aligned to assist. |

| ITEM | Can add to | Optional Additional Concepts (summarized) |
|---|---|---|
| A<br>(orig 4) | 13/588,992 | Diffuse reflective top surfaces ("horizontal") to capture Fresnel reflected light from cover lens (change angle of light)<br>What's New: Deliberate use of diffuse reflected surface on all reasonably achievable surfaces under the cover lens. Diffuse reflection is needed to efficiently redirect the light that has been reflected via Fresnel reflection off the cover lens such that it can escape from the fixture upon redirection. ALSO WHITE PAINT ON ADJACENT BOX COVERS<br>Benefit: Higher efficiency compared to ignoring the Fresnel reflections or trying to redirect using specular reflection. |
| B<br>(orig 5) | 61/511,085 | Type V LED layout to minimize module surface area while not interfering with each other. COMBINE WITH Item G.<br>What's New: Type V layout was optimized to be as small as possible area without the light from one LED impeding another LED.<br>Benefit: Highest possible efficiency with better uniformity and smallest fixture. |
| C<br>(orig 8) | 13/588,992<br>13/483,045 | Uplight and backlight baffles (shields) on main housing<br>What's New: Utilizing the fixture housing as an integral part of the optical system to minimize backlight and prevent uplight. The ring prevents uplight while the "eyelid" reduces backlight. Can be exchanged with type V ring (shorter uplight shield, no backlight shield)<br>Benefit: Designing shields as part of the overall fixture design allows for optimum compactness and eliminates the need to add blockers or baffles as a future add-on to achieve desired uplight and backlight performance. Interchangeability enables us to use a single universal housing for all LED lighting types. |
| D<br>(9) | 13/588,992<br>13/482,045 | Using integrated cover lens for environmental and vandal protection<br>What's New: The fixture (including the entire optical system) was designed with an integrated cover lens (attached inside bottom housing with gasket seal).<br>Benefit: Provides maximum protection from the elements. Also, the lens material and thickness can be changed to achieve various levels of vandal protection - without the usual undesirable loss of lumens and high cost associated with an aftermarket vandal shield. Also can exchange for a more shallow lens to use with type V. |
| E<br>(10) | 13/588,992 | Combination of specular mirror and diffuse secondary lens bottom surface to create a diffuse reflection<br>What's New: A diffuse reflection is desired off the bottom surface of secondary lens to achieve best efficiency and uniformity. Traditional approach is to have smooth/specular lens bottom surface over a diffuse reflector. This limits the options for the reflector material. Our approach used a diffuse/scattering surface (e.g., grit-blasted mold) on the lens bottom along with an inexpensive reflector which can be specular.<br>Benefit: Lower cost while still achieving desired efficiency and distribution. |

| | | |
|---|---|---|
| F (11) | 61/511,085 | Self-centering secondary lens - molded bore on underside of lens aligns with 4 lobes on LED package<br>What's New: Molded into the lens is a circular bore that encircles the 4 protruding lobes present in the LED package. This self-centers the lens, reducing component count and assembly cost while ensuring maximum performance. The circular bore is inherently aligned to the lens inner and outer optical surfaces. Optionally make (at least one) sides of bore straight (a secant) to line up two adjacent corner lobes. Preferably add to the recess to also enclose the square LED substrate.<br>Benefit: Lower cost while simultaneously achieving excellent alignment between the LED and the lens. |
| G (12) | 61/511,085 | Common/universal LED module circuit board (PCB) achieves both II-IV and type V, along with multiple lumen levels, depending on LED placement<br>What's New: A common board design including circuit traces and LED solder pads achieves all distribution and lumen level requirements. Distribution type (II-IV or V) and lumen level (6, 9 or anything in between # of LEDs) is determined by where the LEDs are placed. OPTIMIZED FOR 6 or 9-in-row type II-IV, or 3×3 array type V (double spaced LEDs) COMBINE WITH Item B.<br>Benefit: This minimizes board development cost, inventory SKUs, and board set up/run costs. |

Although the invention has been illustrated and described in detail in the drawings and foregoing description, the same is to be considered as illustrative and not restrictive in character—it being understood that the embodiments shown and described have been selected as representative examples including presently preferred embodiments plus others indicative of the nature of changes and modifications that come within the spirit of the invention(s) being disclosed and within the scope of invention(s) as claimed in this and any other applications that incorporate relevant portions of the present disclosure for support of those claims. Undoubtedly, other "variations" based on the teachings set forth herein will occur to one having ordinary skill in the art to which the present invention most nearly pertains, and such variations are intended to be within the scope of the present disclosure and of any claims to invention supported by said disclosure.

What is claimed is:

1. An LED apparatus for illumination in downward and forward directions toward a preferential side of the apparatus, comprising:
a plurality of LED devices arranged in one or more horizontal rows oriented perpendicularly to the downward and forward directions and mounted to the LED apparatus;
a two axis orthogonally symmetric lens member associated with each LED device; and
a vertical reflector, being a vertically extending planar reflective surface, disposed rearward of and parallel to at least one of the one or more horizontal rows of LED devices; wherein:
the vertical direction is defined as an orthogonal z-axis of the LED apparatus and is perpendicular to the horizontal direction that defines a laterally extending second orthogonal axis of the LED apparatus.

2. The LED apparatus of claim 1 further comprising:
a single row arrangement of the plurality of LED devices.

3. The LED apparatus of claim 1 wherein the vertical reflector comprises:
a specular reflective front surface facing the LED devices.

4. The LED apparatus of claim 1 wherein:
the vertical reflector is curved around ends of the one or more horizontal rows.

5. The LED apparatus of claim 1 further comprising:
an enclosure wherein the one or more horizontal rows are mounted inside the LED apparatus; and
a cover lens mounted to the LED apparatus so as to cover the one or more horizontal rows of LED devices.

6. The LED apparatus of claim 5 wherein the vertical reflector comprises:
a top edge contoured to closely fit under an inner surface of the cover lens.

7. The LED apparatus of claim 5 further comprising:
a backlight shield mounted over an outer surface of the cover lens, the shield comprising a substantially planar vertical wall extending across the cover lens parallel to the one or more rows of LED devices.

8. The LED apparatus of claim 7 wherein the vertical wall of the backlight shield comprises:
a bottom edge contoured to closely fit over the outer surface of the cover lens; and
a distal top edge that describes a straight horizontal line.

9. The LED apparatus of claim 5 further comprising:
a horizontal reflector, being a horizontally extending diffusely reflective surface, disposed across at least a portion of the LED apparatus, and having one or more openings shaped and sized to closely fit around the lens members where they protrude through the horizontal reflector.

10. An LED apparatus for illumination in downward and forward directions toward a preferential side of the apparatus, comprising:
a plurality of LED devices arranged in a single horizontal row oriented perpendicularly to the downward and forward directions and mounted to the LED apparatus; and
a vertical reflector, being a vertically extending planar reflective surface, disposed rearward of, and parallel to the row of LED devices to re-direct light emitted rearward from the plurality of LED devices; wherein:
the vertical direction is defined as an orthogonal z-axis of the LED apparatus and is perpendicular to the horizontal direction that defines a laterally extending second orthogonal axis of the LED apparatus.

11. The LED apparatus of claim 10 wherein:
the vertical reflector is curved around ends of the row of LED devices.

12. The LED apparatus of claim 10 further comprising:
an enclosure wherein the row of LED devices is mounted inside the LED apparatus; and
the vertical reflector has an inner part within the LED apparatus and an outer part outside the LED apparatus.

13. The LED apparatus of claim 12 further comprising:

a cover lens mounted to the LED apparatus so as to cover the row of LED devices; and which divides the inner part from the outer part of the vertical reflector.

14. The LED apparatus of claim 13 wherein:

the inner part of the vertical reflector has a specular reflective front surface facing the LED devices, and a top edge contoured to closely fit under an inner surface of the cover lens;

and further wherein:

the outer part of the vertical reflector has a bottom edge contoured to closely fit over an outer surface of the cover lens.

15. The LED apparatus of claim 14 further comprising:

a ring shield mounted to the LED apparatus such that the outer part of the vertical reflector extends laterally across the ring shield.

16. The LED apparatus of claim 15 wherein:

the outer part of the vertical reflector has a top edge that describes a straight horizontal line.

17. The LED apparatus of claim 16 wherein:

the outer part of the substantially planar vertical reflector is set back from the substantially planar reflective surface of the inner part of the vertical reflector.

18. A method of directing illumination from an LED apparatus in downward and forward directions toward a preferential side forward of the LED apparatus, the method comprising:

mounting a plurality of LED devices to the LED apparatus in a single horizontal row oriented perpendicularly to the downward and forward direction;

mounting a vertical reflector with a planar reflective surface to the LED apparatus rearward of and parallel to the horizontal row of LED devices; and orienting the LED apparatus such that the vertical reflector extends substantially straight downward.

19. The method of claim 18 further comprising:

associating a two axis orthogonally symmetric lens member with each LED device.

20. The method of claim 19 further comprising:

providing the vertical reflector with a specular reflective front surface facing the LED devices.

21. The method of claim 20 further comprising:

disposing the vertical reflector to be set back from the lens members at least a minimum distance that prevents LED light from re-entering a lens member after reflecting off of the vertical reflector front surface.

22. The method of claim 18 further comprising:

curving the vertical reflector around ends of the row of LED devices.

23. The method of claim 18 further comprising:

mounting a cover lens to the LED apparatus so as to cover the row of LED devices; and contouring a top edge of the vertical reflector to closely fit under an inner surface of the cover lens.

24. The method of claim 23 further comprising:

using a backlight shield to continue the vertical reflector outward of the cover lens.

25. The method of claim 24 wherein the backlight shield comprises a substantially planar, generally outward extending wall with a forward facing surface, the method further comprising:

contouring a bottom edge of the backlight shield to closely fit over an outer surface of the cover lens; and relative to the top edge of the vertical reflector, setting back the bottom edge of the backlight shield at least enough to intercept LED light that just passes over the top edge of the vertical reflector, thereby compensating for the thickness of the cover lens.

26. The method of claim 25 further comprising:

providing the backlight shield with a specular reflective forward facing surface; and orienting the substantially planar forward facing surface of the backlight shield to be parallel to an uncurved portion of the substantially planar vertical reflector.

\* \* \* \* \*